United States Patent [19]
Sakaguchi et al.

[11] Patent Number: 6,121,112
[45] Date of Patent: *Sep. 19, 2000

[54] FABRICATION METHOD FOR SEMICONDUCTOR SUBSTRATE

[75] Inventors: Kiyofumi Sakaguchi, Yokohama; Takao Yonehara, Atsugi, both of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/693,795

[22] Filed: Jul. 31, 1996

[30] Foreign Application Priority Data

Aug. 29, 1905 [JP] Japan .................................. 7-197545

[51] Int. Cl.$^7$ ................................... H01L 21/76
[52] U.S. Cl. .................. 438/406; 438/409; 438/459; 438/466; 438/705; 438/960
[58] Field of Search ................... 438/406, 409, 438/459, 466, 705, 960

[56] References Cited

U.S. PATENT DOCUMENTS

| | | |
|---|---|---|
| 4,016,017 | 4/1977 | Aboaf et al. . |
| 5,277,748 | 1/1994 | Sakaguchi et al. . |
| 5,278,093 | 1/1994 | Yonehara . |
| 5,290,712 | 3/1994 | Sato et al. . |
| 5,403,771 | 4/1995 | Nishida et al. . |
| 5,453,394 | 9/1995 | Yonehara et al. . |
| 5,457,058 | 10/1995 | Yonehara . |
| 5,970,361 | 10/1999 | Kumomi et al. ................. 438/409 |

FOREIGN PATENT DOCUMENTS

| | | |
|---|---|---|
| 0285358A2 | 10/1988 | European Pat. Off. . |
| 0469630A2 | 2/1992 | European Pat. Off. . |
| 0499488A2 | 8/1992 | European Pat. Off. . |
| 0515181A2 | 11/1992 | European Pat. Off. . |
| 0553852A2 | 8/1993 | European Pat. Off. . |
| 0553859A2 | 8/1993 | European Pat. Off. . |

OTHER PUBLICATIONS

A. Uiilir, Jr., "Electrolytic Shaping of Germanium and Silicon", *The Bell System Technical Journal*, vol. XXXV, 1956, pp. 333–347.

T. Unagami, "Formation Mechanism of Porous Silicon Layer by Anodization in HF Solution", *Journal of the Electrochemical Society*, vol. 127, No, 2; Feb. 1980, pp. 476–483.

G.W. Cullen, "Single–Crystal Silicon On Single Crystal Insulators", *Journal of Crystal Growth*, vol. 63, No. 3, Oct. 11, 1983.

K. Imai et al., "Crystalline Quality of Silicon Layer Formed By FIPOS, Technology", *Journal of Crystal Growth*, vol. 63, (1983), pp. 547–553.

K. Imai, "A New Dielectric Isolation Method Using Porous Silicon", *Solid–State Electronics*; vol. 24, 1991, pp. 159–164.

*Primary Examiner*—George Fourson
*Attorney, Agent, or Firm*—Fitzpatrick, Cella, Harper & Scinto

[57] ABSTRACT

A method for fabricating a semiconductor substrate comprises the steps of employing a diffusion method to diffuse, in a silicon substrate, an element, which is capable of controlling a conductive type, and to form a diffused region, forming a porous layer in the diffused region, forming a non-porous single crystal layer on the porous layer, bonding the non-porous single crystal layer to a base substrate, while an insulation layer is provided either on a surface to be bonded of the non-porous single crystal layer or on a surface to be bonded of the base substrate, and removing the porous layer.

187 Claims, 7 Drawing Sheets

FABRICATION METHOD FOR SEMICONDUCTOR SUBSTRATE

BACKGROUND OF THE INVENTION

1. Field of the Invention

The present invention relates to a semiconductor substrate, and to a method for its fabrication. More particularly, the present invention pertains to a semiconductor substrate that can be applied for dielectric separation, or to an electronic device or an integrated circuit that is fabricated on a single crystal semiconductor layer on an insulator, and to a fabrication method for the semiconductor substrate.

2. Related Background Art

The formation of a single crystal Si semiconductor layer on an insulator constitutes a widely known procedure that is called the silicon on an insulator (SOI) technique. Many studies of this technique have been performed, since a device using the SOI technique has a number of superior features available that can not be obtained using the bulk Si substrates with which normal Si integrated circuits are fabricated. By employing the SOI technique the following superior features are provided:

1) Easy isolation of dielectrics, and large-scale integration capability.
2) Excellent radio resistance capability.
3) Reduction in stray capacitance, and increased speed.
4) Omission of well procedure.
5) Latch-up prevention capability.
6) Provision of fully depleted type field effect transistor when film thickness is decreased.

A method for forming the SOI structure that has many advantageous device characteristics is described in, for example, Special Issue: "Single-crystal Silicon on Non-Single Crystal Insulators"; edited by G. W. Cullen, Journal of Crystal Growth, Volume 63, No. 3, pp. 429 to 590 (1983).

A previous method that has been studied is the one called SOS (silicon on sapphire), which involves the forming, by hetero epitaxial growth, of Si on a single crystal sapphire substrate using the CVD method (Chemical Vapor Deposition method. This method, the most advanced SOI technique, has been used successfully; however, the applications for which SOS can be employed are limited because of the occurrence of many crystal defects, due to the mismatching of lattices between the surfaces of the Si layers and sapphire substrate underlayers; the infiltration of Si layers by aluminum from the sapphire substrates; and, especially, the high manufacturing costs for the substrates; and the fact that the technique for increasing substrate dimensions is still in the process of being developed. Recently, therefore, attempts have been made to provide the SOI structure without using a sapphire substrate. In general, these attempts have been made by performing one of the following two procedures:

1) After the surface of a Si, single crystal substrate has been oxidized, a portion of the Si substrate is exposed, and while that portion is used as a seed, Si is epitaxially and laterally grown to form a Si, single crystal layer on $SiO_2$ (in this case, the procedure is accompanied by depositing a Si layer on the $SiO_2$).
2) A Si, single crystal substrate is used as an active layer, and $SiO_2$ is formed under the active layer (here, the procedure is not accompanied by depositing a Si layer).

Well known methods for performing procedure 1) are: a method whereby a single crystal layer Si is directly grown, epitaxially and laterally, by the CVD method; a method whereby non-crystalline Si is deposited and is epitaxially and laterally grown in a solid phase by thermal processing; a method whereby a convergent energy beam, such as an electron beam or a laser beam, is employed to irradiate a non-crystalline, or polycrystalline Si layer, and a single crystal layer is grown on $SiO_2$ by melting recrystallization; and a method whereby a melted zone is scanned as a band by a rod heater (zone melting and recrystallization). These methods all have merits and demerits. As they all, more or less, have problems of control, productivity, uniformity and quality, no practical use of any of them has yet been made. For example, with the CVD method, where sacrificial oxidization is required to form a flat, thin film, the crystallization that it provides in the solid-phase growing method is not good. In the beam annealing method, shortcomings are encountered in the processing time that is required for a convergent beam scan, and with the controls for the overlapping of beams and for the adjustment of focus. Although the zone melting recrystallization method is the most advanced and has been used on an experimental basis for the manufacture of comparatively large integrated circuits, many crystal defects occur, with this method such as sub-crystal grain boundary defects. The method is not yet practical for the fabrication of minority carrier devices.

As for procedure 2), there are three methods by which it can be performed.

1) A method whereby an oxide film is formed on a Si single crystal substrate, in the surface of which a V-shaped groove is anisotropically etched, and on the oxide film is deposited a polycrystalline Si layer, which is as thick as the Si substrate. The reverse surface of the Si substrate is ground down, and formed on the thick polycrystalline Si layer, and circumscribed by the V-shaped groove, is a Si single crystal zone that is dielectrically isolated. Although preferable crystallinity is preferable, problems of control and productivity are encountered while using the procedure for depositing a polycrystalline Si layer of several hundred microns, and while using the procedure by which the reverse surface of the single crystal Si substrate is ground to obtain the isolated active Si layer.
2) A method called SIMOX (separation by ion implanted oxygen), whereby an $SiO_2$ layer is formed by the implantation of oxygen ions into a single crystal Si substrate, is currently the most advanced method because this method provides excellent matching with a Si process. However, since $10^{16}$ ions/cm$^2$ oxygen ions must be implanted to form an $SiO_2$ layer, and a long time is required for the implantation process, productivity is not high. In addition, the SIMOX wafers are expensive, and, furthermore, have a comparatively large number of crystal defects. For industrial use, the quality of the final products is inadequate for the fabrication of minority carrier devices.
3) A method whereby an SOI structure is formed by dielectric separation, due to oxidation of porous Si; one by which an N-type Si layer is formed, in the shape of an island, on the surface a P-type Si single crystal substrate by the implantation of proton ions (Imai, et al. "J. Crystal Growth", Vol. 63, 547 (1983)), or by epitaxial growing and patterning, with only the p-type Si substrate being changed and made porous by anodization in an HF solution so that the Si island is enclosed on the surface, and so that the N-type Si island is dielectrically isolated by higher speed oxidation. According to this method, the isolated Si region is determined before the device procedure is performed, and thus the degree of freedom for the device design is limited.

In Japanese Patent Application Laid-Open No. 5-21338 the present applicant proposed a new method to be used for resolving the above problems.

With the method disclosed in Japanese Patent Application Laid-Open No. 5-21338, which is a method for the fabrication of a semiconductor member, a member is formed with a porous single-crystal semiconductor region on which is positioned a non-porous single-crystal semiconductor region; then, another member, the surface of which is an insulating material, is bonded to the surface of the non-porous single-crystal semiconductor region; and finally, the porous single-crystal semiconductor region is removed by etching.

This method can be applied for the fabrication of an SOI substrate, and is an excellent method to selectively etch the porous single-crystal semiconductor region and the non-porous single-crystal semiconductor region to obtain an SOI substrate that has, for example, a silicon active layer with a uniform thickness. One example application of the SOI substrate of the method disclosed in Japanese Patent Application Laid-Open No. 5-21338, primarily includes a procedure for altering a single-crystal silicon substrate to make it porous; a procedure for epitaxially growing a single-crystal silicon on the porous silicon layer; a procedure for bonding an epitaxial silicon film, which is formed on the porous silicon layer, to another substrate by means of an insulation layer; and a procedure for removing the porous silicon layer from the bonded substrate so to leave the epitaxial silicon layer on the insulation layer.

As can be understood from this example, the above described method provides excellent productivity, uniformity, control and economical operation for the forming, on an insulation layer, of an Si single-crystal layer having crystallinity is as excellent as a single-crystal wafer. According to this method, a single-crystal silicon layer (active layer) that constitutes the SOI substrate can be formed by a film formation technique such as the CVD method, the bonding procedure is performed, and the porous silicon layer is removed by selective etching of the porous silicon layer in preference to the single-crystal silicon layer (active layer).

The present inventors discussed improving the method disclosed in Japanese Patent Application Laid-Open No. 5-21338 and determined that the manufacturing costs can be reduced. That is, the method disclosed in Japanese Patent Application Laid-Open No. 5-21338 performs excellently at a laboratory level. If, with this method, the costs can be further reduced for the manufacture of semiconductor members in large factories, this method can contribute more to industrial development.

From this point of view, the present inventors discussed the above method, and acquired knowledge that will enable manufacturing costs to be further lowered by taking into consideration the type of silicon substrate that is to be altered and made porous.

The altering of silicon (Si) to make it porous will be explained.

A Si substrate can be altered and made porous by anodization using an HF solution. The porous Si layer tends to be formed in a P-type Si layer rather than an N-type Si layer for the following reasons.

Porous Si was discovered by Uhlir in 1956 while studying a process for the electrolytic grinding of a semiconductor (A. Uhlir, Bell Syst. Tech. J., Vol. 35, 333, (1956)).

Unagami, et al. studied the dissolution reaction of Si during anodization, and reported that positive holes are necessary for the anode reaction of Si in the HF solution and that the reactions are as follows (T. Unagami, J. Electrochem. Soc. Vol. 127, 476 (1980)).

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

or, $$Si + 4HF + (4-\lambda)e^+ \rightarrow SiF_4 + 4H^+ + \lambda e^-$$

$$SiF_4 + 2HF \rightarrow H_2SiF_6$$

where $e^+$ and $e^-$ respectively represent a positive hole and an electron, and n and $\lambda$ are respective positive hole counts that are required to dissolve Si atoms. It is assumed that when $n > 2$ or $\lambda > 4$ is satisfied, porous Si is formed.

As a result, P-type Si that has positive holes tends to become porous readily, while it is difficult to make N-type Si porous. The selection for the altering of a porous silicon substrate was proven by Nagano, et al., and by Imai (Nagano, Nakajima, Yasuno, Onaka and Kajiwara, Electronic communication society study report, Vol. 79, SSD79-9549 (1979)) and (K. Imai, "Solid-State Electronics", Vol. 24, 159 (1981)).

From observations made using a transmission electron microscope, while a porous Si layer has pores with an average diameter of several tens to several hundreds of angstroms, it is maintained as a single crystal, and a single crystal Si layer can be epitaxially grown atop the porous layer. At 1000° C. or higher, however, interior pores may be rearranged, and higher-speed etching may be degraded. For the epitaxial growth of the Si layer, low-temperature growth, such as molecular beam epitaxial deposition, plasma CVD, decompression CVD, optical CVD, bias sputtering, or liquid phase epitaxy, is preferable.

Since many gaps are formed inside the porous layer, the density is reduced to half or less. As a result, the surface area is drastically increased, when compared with the volume, and compared with the normal etching speed for a single crystal layer, the chemical etching speed of the layer is substantially increased.

By utilizing the above described feature of porous Si, a bonded wafer can be fabricated by the etch-back method, which is described in the previously described Japanese Patent Application Laid-Open No. 5-21338.

Procedures for providing a porous silicon substrate that is disclosed in Japanese Patent Application Laid-Open No. 5-21338 are listed below:

(1) A P-type substrate is prepared and altered so that it is porous.

(2) A layer having a low-impurity density is formed on a P-type substrate by a thin-film deposition method, such as epitaxial deposition, and the P-type substrate portion is altered so that it is porous.

(3) An N-type single crystal layer is formed by implanted proton ions into the surface of a P-type substrate, and the P-type portion that remains is altered so that it is porous.

In the methods shown in (1) through (3), a P-type silicon substrate is employed. In order to produce a large quantity of uniformly porous silicon substrates in a large factory, a P-type silicon for which the resistivity value is strictly adjusted must be used because anodization is performed by utilizing the anodic reaction of the silicon, and a silicon substrate for which the resistivity value is specified is comparatively expensive. If a silicon substrate can be used regardless of its resistivity value, the manufacturing cost of an SOI substrate can be further reduced.

SUMMARY OF THE INVENTION

It is therefore one object of the present invention to provide a method, for fabrication of a semiconductor substrate, that is obtained by improving the method disclosed in Japanese Patent Application Laid-Open No. 5-21338.

It is another object of the present invention to provide a method, for the fabrication of a semiconductor substrate, whereby the manufacturing costs for an SOI substrate can be further reduced.

It is an additional object of the present invention to provide a method, for the fabrication of a semiconductor substrate, that is appropriate for the manufacture of semiconductor substrates in factories.

The above objects are achieved by the present invention, which is designed as follows.

According to a first aspect of the present invention, a method for fabricating a semiconductor substrate comprises the steps of:

employing a diffusion method to diffuse, in a silicon substrate, an element, which is capable of controlling a conductivity type, and to form a diffused region;

forming a porous layer in the diffused region;

forming a non-porous single crystal layer on the porous layer;

bonding the non-porous single crystal layer to a base substrate, while an insulation layer is provided either on a surface to be bonded of the non-porous single crystal layer or on a surface to be bonded of the base substrate; and removing the porous layer.

According to a second aspect of the present invention, a method for fabricating a semiconductor substrate comprises the steps of:

employing a diffusion method to diffuse an element, which is capable of controlling a conductivity type, in a first surface of a silicon substrate and in a second surface on a reverse side of the first surface, and to form a diffused region;

forming a porous layer in the diffused region that is formed on the first surface;

forming a non-porous single crystal layer on the porous layer;

bonding the non-porous single crystal layer and a base substrate, while an insulation layer is provided either on a surface to be bonded of the non-porous single crystal layer or on a surface to be bonded of the base substrate; and removing the porous layer.

The above described objects are achieved by the present invention as constituted above. In the present invention, an element that can control a conductivity type is diffused by a diffusion method to form a diffused region, and a porous layer is formed in the region. Therefore, even when a silicon substrate for which the resistivity value is strictly controlled is not used, the silicon substrate can be so altered that it is uniformly porous. In other words, a silicon substrate having a low price and for which a resistivity value is not specified can be employed.

Further, according to a mode for forming a diffusion layer on both surfaces of a substrate, the bending that occurs during the forming of diffusion layers can be reduced. As a result, a satisfactory bonding procedure can be performed, and the possibility that bonded substrates will peel off is substantially reduced. Therefore, the acquired yield of semiconductor substrates is increased, and the manufacturing costs for the substrates can be reduced. In addition, contact resistance that occurs when a porous layer is formed by anodization can be reduced.

DETAILED DESCRIPTION OF THE PREFERRED EMBODIMENTS

A method according to the present invention for fabricating a semiconductor substrate is as previously described. The most distinctive feature of the fabrication method of the present invention is that, after a diffused region is formed in a silicon substrate by a diffusion method, a porous layer is formed in the diffused region. Based on this feature, the present invention will be described in detail while referring to FIGS. 1A through 1F.

EXAMPLE 1

Figure 1A:
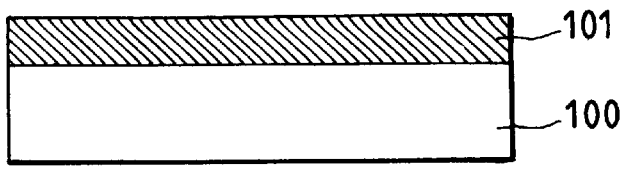
FIGS. 1A through 1F are diagrams illustrating one example of a method according to the present invention for the fabrication of a semiconductor substrate.

FIGS. 1A through 1F are diagrams illustrating one example of the method of the present invention for the fabrication of a semiconductor substrate. First, an element that controls conduction is diffused in a single crystal silicon substrate (silicon wafer) 100 by using a diffusion method (FIG. 1A).

In the present invention, a diffusion layer having a density at which it will easily become porous is formed in a single crystal silicon substrate by using a diffusion method. Even if a comparatively expensive single crystal silicon substrate for which the resistance is strictly controlled is not employed, a steady process for altering a silicon substrate and making it porous can be performed, while a difference between silicon substrates is reduced.

In the present invention, an element that can control a conductivity type and that is to be diffused into a silicon substrate by the diffusion method are those that are generally used with the semiconductor fabricating process technique and, for example, those shown in Table 1.

TABLE 1

Elements which can control conductivity type

| Conductivity Type | Elements |
| --- | --- |
| n | P, As, Sb |
| p | B |

It is preferable that because of manufacturing costs a diffusion method be adopted whereby elements that can control a conductivity type are thermally diffused in a silicon substrate. Examples of such a method are shown in Table 2.

TABLE 2

Element diffusion method

| Diffusion Method | Diffusion Source | Furnace |
| --- | --- | --- |
| Tube Opening Method | POCl$_3$, BN, PH$_3$ | Diffusion Furnace |
| Slusher | Coating Glass | Diffusion Furnace |
| Doped Film Use | Doped Oxide (CVDPSG) Doped poly Si | Diffusion Furnace |
| Tube Closing Method | As (Solid), BCl$_3$, PH$_3$ Capsule | Diffusion Furnace |

In the present invention, a porous layer is formed in the diffused region. The porous layer can be formed more easily in a P-type diffused region than in an N-type diffused region. Based on this, the technique for diffusing B (boron) is as shown in Table 3, for example.

TABLE 3

Boron diffusion technique

| Gas Source | B$_2$H$_6$ |
| --- | --- |
| Liquid Source | BBr$_3$ |
| Solid Source | B$_2$O$_3$ |
| Solid - Solid Diffusion | CVD Film, BSG, Spin Coated Film |

Also according to the technique shown in Table 3, basically, an element that is supplied from a source is diffused into a silicon substrate by using a thermal process in a "furnace".

For example, a diffusion method using a spin coated film is performed as follows.

Figure 6:
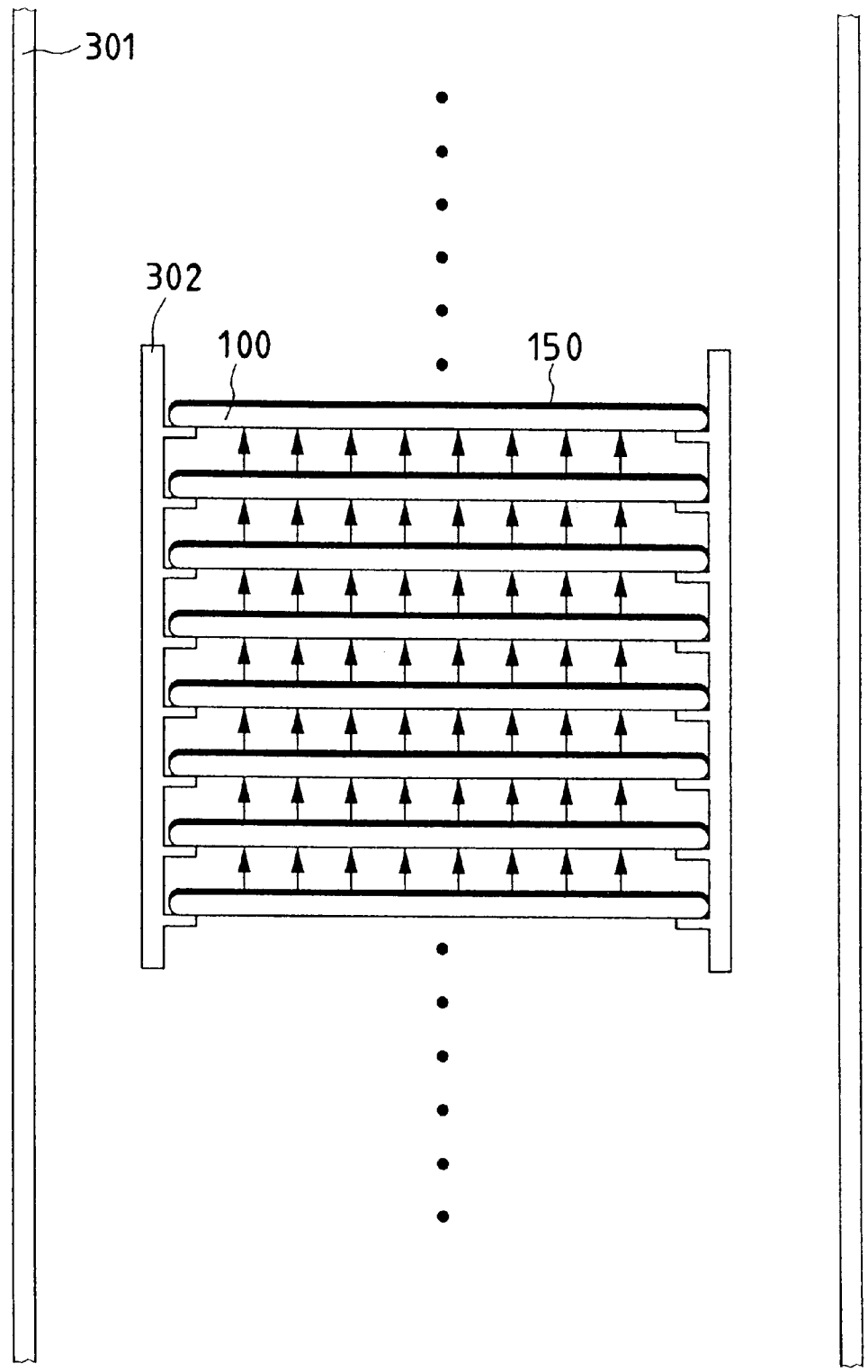
FIG. 6 is a diagram illustrating one example of a diffusion procedure that can be applied for the present invention.

A mixture consisting of an organic binder and a solvent containing B$_2$O$_3$ is evenly coated on a silicon substrate (silicon wafer) by using a spinner. Thereafter, the silicon substrate is dried and annealed to form a B$_2$O$_3$ film thereon. Then, the resultant silicon substrate is placed in a furnace shown in FIG. 6 and boron (B) is diffused by using a thermal process. In FIG. 6, reference numeral 301 denotes a furnace and 302 denotes a susceptor. A B$_2$O$_3$ film is coated on one of the surfaces of a silicon substrate 100. A thermal process is performed on the silicon substrate 100 by the device shown in FIG. 6 at 900° C. to 1300° C., and boron (B) is diffused into the silicon substrate 100. In this case, a diffused region is formed not only in the face whereon the B$_2$O$_3$ film is deposited, also in the reverse face by using, as a source, a B$_2$O$_3$ film that is formed on another, adjacent silicon substrate. It is very convenient for a diffusion layer to be formed on both surfaces of a silicon substrate because the resistance when in contact with an HF solution can be reduced in a porous formation by anodization.

In the present invention, while taking into consideration the porous formation process and the characteristics of an epitaxial film, which is formed on a porous silicon layer, the concentration of the element that can control a conductivity type and that are contained in a diffused region, generally falls within a range of $5.0 \times 10^{16}/\text{cm}^3$ to $5.0 \times 10^{20}/\text{cm}^3$, or preferably, a range of $1.0 \times 10^{17}/\text{cm}^3$ to $2.0 \times 10^{20}/\text{cm}^3$, and most preferably, within a range of $5.0 \times 10^{17}/\text{cm}^3$ to $1.0 \times 10^{20}/\text{cm}^3$.

The thickness of the diffused region that is formed with the present invention can be controlled by adjusting the temperature and the period of time for the heating. The thickness of the diffusion layer is generally 100 Å or greater, or preferably, 500 Å or greater, and most preferably, 5000 Å or greater. However, since the porous formation process that is to be performed after the formation of the diffused region advances easily over the diffused region, the diffused region that is formed is not always thick.

Although, in FIG. 1A, a diffusion layer 101 is formed on only one surface of the silicon substrate 100, the diffusion layer 101 can be formed on both surfaces of the silicon substrate 100.

Basically, for the present invention, any type of single crystal silicon substrate (silicon wafer) can be adopted as a silicon substrate on which a diffusion layer is formed. However, when the purpose is the fabrication of a semiconductor substrate at a low cost, it is preferable that there be employed a comparatively inexpensive silicon substrate, for which a resistance is not designated; a monitor wafer, which is employed for an IC process; or a so-called reproduced wafer, the surface of which is so polished that the wafer can be used again in an IC process.

In this invention, a porous layer is formed after the diffusion layer is formed.

A non-porous single crystal silicon substrate (silicon wafer) can be altered to make it porous by anodization. The obtained porous silicon layer has multiple pores with an average diameter of about 50 Å to 300 Å and maintains single crystal structure.

Figure 1B:
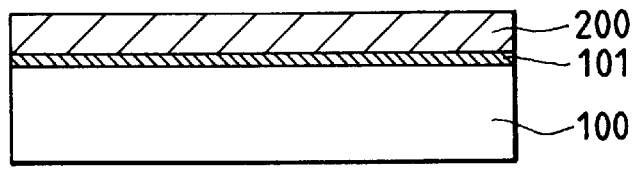

Referring to FIG. 1B, a porous layer 200 is formed in the diffusion layer 101. The entire diffusion layer 101 may be altered to make it porous, or as is shown in FIG. 1B, a part of the diffusion layer 101 may be omitted from the process. The entire diffusion layer 101 and one part of the silicon substrate 100 may be altered so that they are porous.

The thickness for the porous formation need be only about 5 μm to 20 μm of the surface layer on one side of the substrate. The entire silicon substrate 100 may be anodized.

Figure 7A:
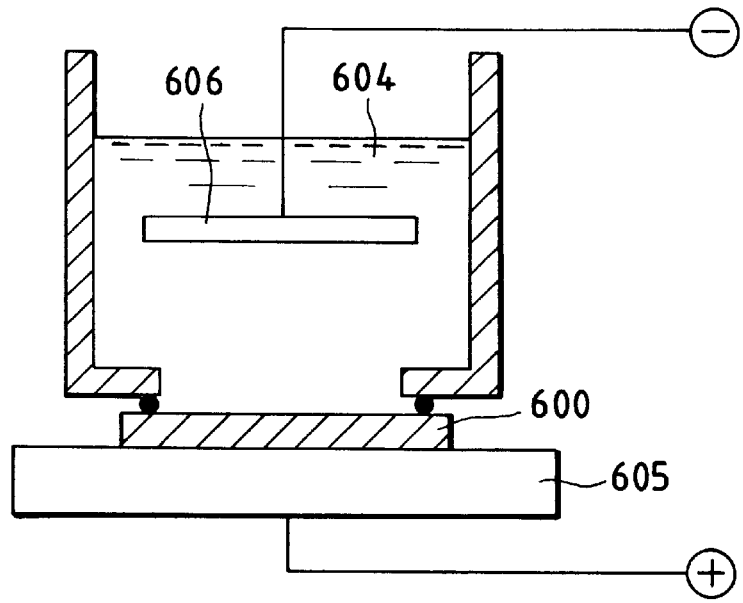
FIGS. 7A and 7B are diagrams illustrating a method for forming a porous silicon layer.
Figure 7B:
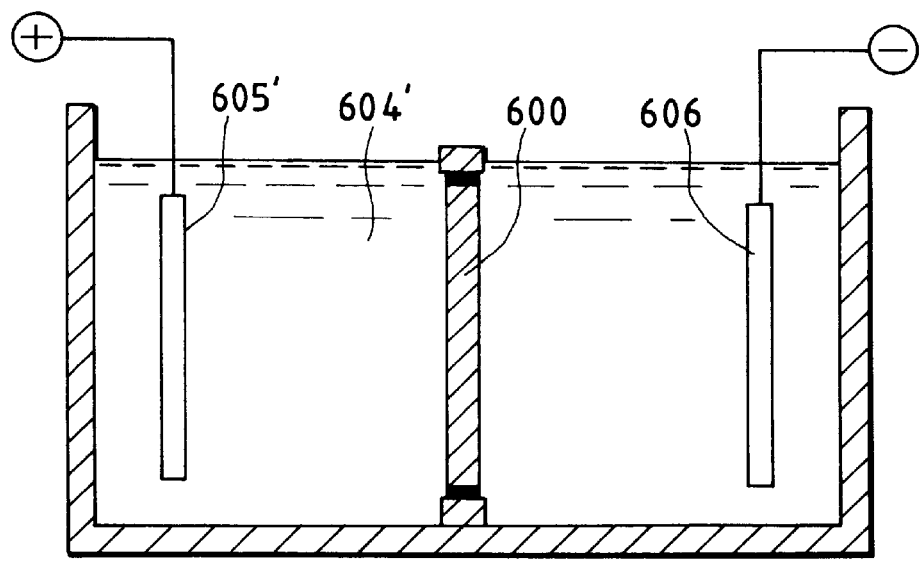

The method for forming a porous silicon layer will now be described while referring to FIGS. 7A and 7B. A substrate 600, on which a diffusion layer is formed, is placed in a device shown in FIG. 7A. More specifically, the face of the substrate 600 on which the diffusion layer is formed contacts a fluoride solution 604 wherein is positioned a negative electrode 606. The other side of the substrate 600 contacts a positive metal electrode 605. For another setup, as is shown in FIG. 7B, a positive electrode 605' may also acquire an electric potential via a solution 604'. Enriched fluoride (49% HF) is generally used as the fluoride solution 604. It is not advisable for a solution to be diluted with pure water (H$_2$O) because etching occurs at a specific concentration of the solution, depending on the strength of the current that flows through it. When bubbles are generated at the surface of the substrate 600 during the anodization, alcohol can be added as a surfactant in order to efficiently remove the bubbles. Such alcohol can be methanol, ethanol, propanol or isopropanol. Further, a stirring device may be used instead of a surfactant to stir a solution for anodization. The negative electrode 606 is formed of a material, such as gold (Au) or platinum (Pt), that resists corrosion in a fluoride solution. The positive electrode 605 is formed of a common metal material. Since the fluoride solution 604 reaches the positive electrode 605 when anodization for the substrate 600 has been completed, a metal film that resists corrosion in a fluoride solution should also be coated on the surface of the positive electrode 605. The maximum strength of a current for anodization is several hundreds of $mA/cm^2$, and the minimum can be any strength except zero. This current strength is determined for a range within which epitaxial growth of good quality is available on the surface of the porous silicon substrate. Normally, with a large current strength, the speed of anodization is increased, and at the same time the density of the porous silicon layer is reduced. In other words, the internal volume of the pores is increased. The condition of the epitaxial growth is therefore varied. In the present invention, while taking the characteristics of an epitaxial layer and the manufacturing costs into account, the porosity (pore volume/(remaining silicon volume+pore volume)) of the porous silicon layer is generally 50% or less, falling preferably in a range of 1% to 40%, and most preferably in a range of 5% to 30%.

Figure 1C:
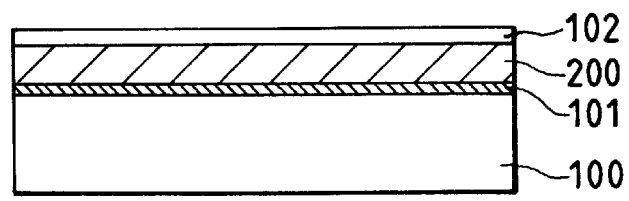

A non-porous single crystal silicon layer 102 is epitaxially grown on the thus formed porous layer 101 (FIG. 1C). To form the single crystal semiconductor layer 102 on the porous layer 101, a common epitaxial crystal growing method, such as the CVD (Chemical Vapor Deposition) method, the MBE (Molecular Beam Epitaxy) method or the bias sputtering method, can be adopted.

Figure 1D:
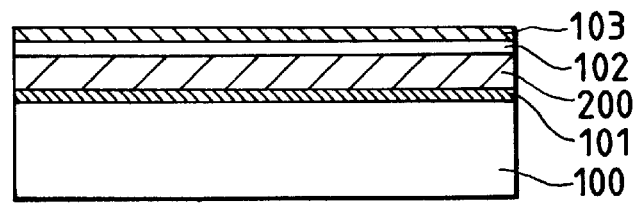

Then, an insulation layer 103 is formed on the surface of the epitaxial layer 102 (FIG. 1D). The insulation layer 103 can be formed of a deposited film (e.g., $SiO_2$ film or $Si_3N_4$ film) using the CVD method, or can be formed by thermal oxidation of the surface of the epitaxial layer 102. The formation of the insulation layer 103 on the epitaxial layer 102 is so effective for the next procedure, for directly bonding the epitaxial layer 102 with a base substrate, that it is possible to reduce the instability of the property of a thin film device, which is caused by the segregation of impurities on the bonded surfaces and by the frequent occurrence of dangling bonds of the atoms on the surfaces, both of these phenomena tending to occur during the bonding procedure.

The step of forming the $SiO_2$ film 103 on the epitaxial layer 102 is not required. If a device is so designed that the above phenomena do not become problems, this step may be omitted. Although the $SiO_2$ layer 103 serves as an insulation layer for an SOI substrate, the insulation layer must be formed on at least one surface of one of the substrates that are to be bonded, and there are various modes for forming the insulation layer. The insulation layer is not limited to an $SiO_2$ layer.

When oxidation is performed, an oxide film need only be thick enough not to be affected by contamination from air that is absorbed by the bonded surface.

Prepared separately from the substrate 100 that has an epitaxial face of which the surface is oxidized is a substrate 110 that has an $SiO_2$ layer 104 thereon and that serves as a base substrate. The base layer 110 is a silicon substrate, the surface of which is oxidized (including by thermal oxidation), a substrate of quartz glass, a substrate of crystallized glass, or an arbitrary substrate on which $SiO_2$ is deposited. A silicon substrate on which the $SiO_2$ layer 104 has not been formed can also be employed.

Figure 1E:
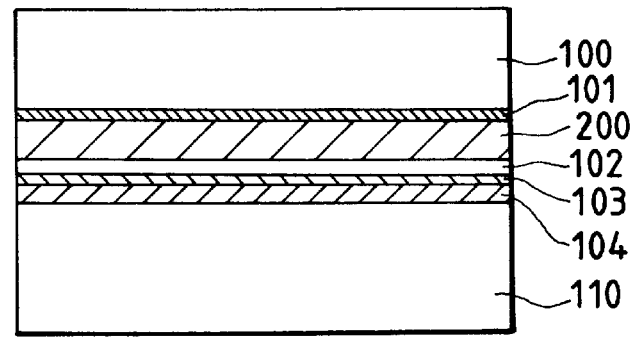

The two prepared substrates are washed and bonded together (FIG. 1E). The washing process for them is performed in consonance with a procedure that is used for washing ordinary semiconductor substrates (e.g., before oxidation).

By applying pressure to the surfaces of the substrates when they are bonded together, the bonding strength can be increased.

A thermal process is performed on the bonded substrates to increase the bonding strength. Although heating at a high temperature is preferable, with a temperature that is excessively high, the an excessively high temperature is used, the constitution of the porous layer 101 may be altered, and impurities that are contained in the substrates may be diffused to the epitaxial layer. Thus a temperature and a period of time must be selected for the heating that ensure these phenomena do not occur. Specifically, 600° C. to 1100° C. is preferable. A thermal process, however, can not be performed for some substrates. For example, the base substrate 110 composed of quartz glass can be heated only to 200° C. or lower because a coefficient of the thermal expansion for quartz differs from that of silicon. When the heating temperature exceeds 200° C., the bonded substrates are peeled away from each other by stress or they are broken. It should be noted, however, that the thermal process need only provide sufficient strength to resist the stress that occurs during the grinding or the etching of the bulk silicon 100, which is performed at the following procedure. Therefore, if the condition for processing the surface for activation is optimized, the thermal process can even be performed at a temperature of 200° C. or lower.

Figure 1F:
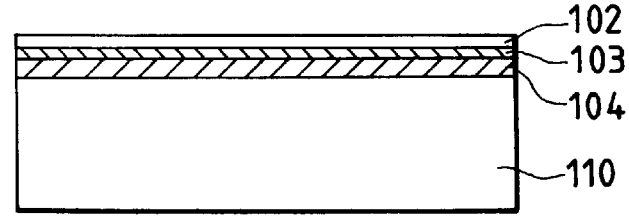
Figure 2A:
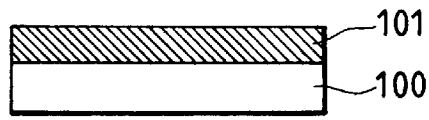
FIGS. 2A through 2H are diagrams illustrating another example of the method according to the present invention for the fabrication of a semiconductor substrate.
Figure 2B:
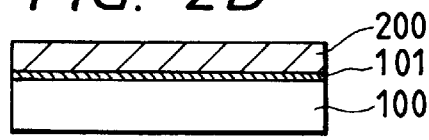
Figure 2C:
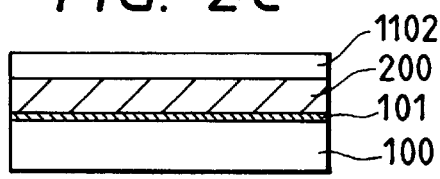
Figure 2F:
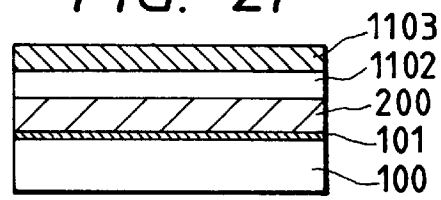
Figure 2D:
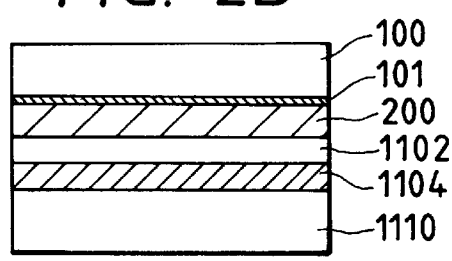
Figure 2G:
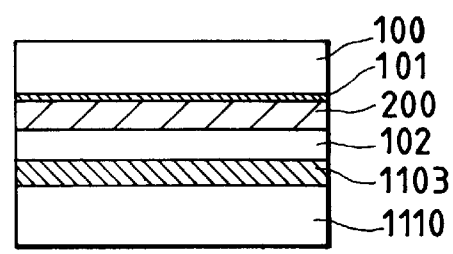
Figure 2E:
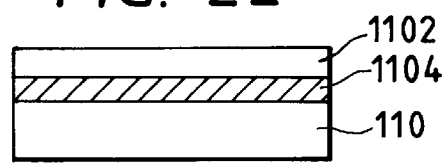
Figure 2H:
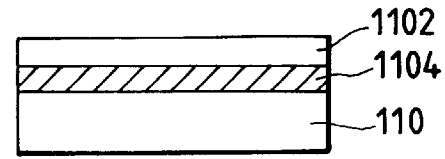
Figure 3A:
FIGS. 3A through 3H are diagrams illustrating an additional example of the method according to the present invention for the fabrication of a semiconductor substrate.
Figure 3B:
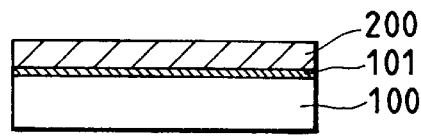
Figure 3C:
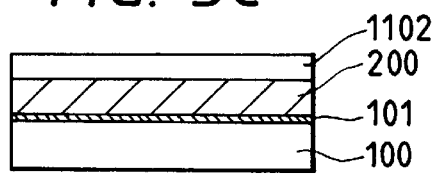
Figure 3F:
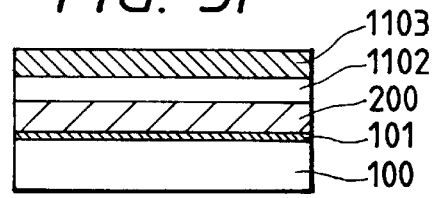
Figure 3D:
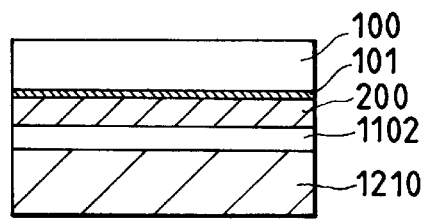
Figure 3G:
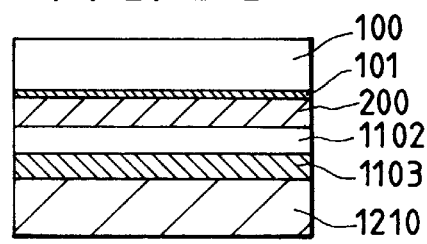
Figure 3E:
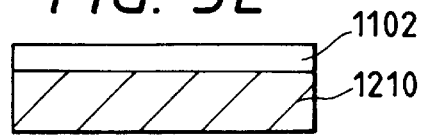
Figure 3H:
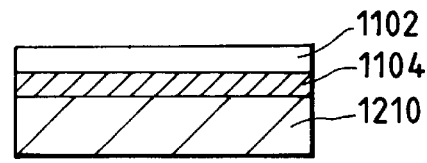

Then, the silicon substrate 100 and the porous layer 200 are removed while the epitaxial layer 102 is retained (FIG. 1F). In this manner, the SOI substrate can be obtained. If the entire silicon substrate 100 has been altered to make it porous, the removal of the silicon substrate is not required.

According to the present invention, etching can preferably be employed to selectively remove a porous layer. An etching agent is, for example, an ordinary Si etching solution, hydrogen fluoride for selective etching of porous Si, a mixture consisting of hydrogen fluoride and, at the least, either alcohol or hydrogen peroxide, buffered hydrogen fluoride, or a mixture consisting of buffered hydrogen fluoride and, at the least, either alcohol or hydrogen peroxide. Since the porous Si layer has a large surface area, it can be selectively etched even with an ordinary Si etching solution.

Although the layer 102 is regarded as an epitaxial silicon layer in the example shown in FIGS. 1A through 1F, the layer 102 can be formed of a single crystal compound semiconductor, such as the II-VI family or III-V family, and such a compound semiconductor layer can be laminated over the epitaxial layer.

In addition, the following procedures can be performed.
(1) Preoxidation of the interior walls of pores in a porous layer.

The walls between adjacent pores in a porous layer are very thin, several nm to several tens of nm. In the process during which the porous layer is heated at a high temperature, e.g., in the process for forming an epitaxial silicon layer, or in the process for the thermal treatment of the bonded substrates, pore walls become cohesive and rough and close pores. As a result, the etching speed is reduced. A thin oxide film is therefore deposited on the pore walls after the porous layer is formed in order to prevent the pore walls from becoming rough. However, since it is necessary for a non-porous single crystal silicon layer to be epitaxially grown on the porous layer, only the surface of the interior walls of the pores in the porous layer must be oxidized, so that inside of the pore walls a single crystalline structure is maintained. It is preferable that an oxide film be several Å to several tens of Å. An oxide film having that thickness is formed by heating in an oxygen atmosphere at a temperature of 200° C. to 700° C., preferably 250° C. to 500° C.

(2) Hydrogen baking process

The present inventors stated in European Patent Publication No. EP 553852 A2 that minute roughness is removed from a silicon surface by heating the surface in a hydrogen atmosphere, and as a result a very smooth silicon surface can be acquired. Baking in a hydrogen atmosphere can be also used for the present invention. The hydrogen baking process can be performed, for example, after the porous silicon layer is formed and, before the epitaxial silicon layer is formed, and can also be performed on an SOI substrate that is obtained after the porous silicon layer is removed by etching. In the hydrogen baking process that is performed before the formation of the epitaxial silicon layer, a phenomenon occurs whereby the outermost surfaces of the pores are closed by the migration of silicon atoms, which constitute the surface of a porous silicon layer. When the formation of the epitaxial silicon surface is performed while the outermost surfaces of the pores are closed, the resulting epitaxial silicon layer has fewer crystal defects. In the hydrogen baking process that is performed after the porous silicon layer is removed by etching, the surface of the epitaxial silicon layer, which is more or less rough as a result of etching, is smoothed. Further, and boron in a clean room that is inevitably absorbed by the bonded surfaces during the bonding process can be evaporated.

One example of the method of the present invention for fabricating a semiconductor substrate has been explained while referring to FIGS. 1A through 1F. The other examples where structures of members to be bonded differ will now be explained.

EXAMPLE 2

An example shown in FIGS. 2A through 2H will be explained. The same reference numerals as are used in FIGS. 1A through 1F are also used in FIGS. 2A through 2H to denote corresponding or identical components. Although, in the example shown in FIGS. 1A through 1F, the insulation layers ($SiO_2$ layers) 103 and 104 are formed on the respective surfaces of the two substrates that are to be bonded together, the insulation layer (e.g., $SiO_2$) is not always formed on both surfaces, and need only be formed on at least one surface. In this example are shown a structure (FIG. 2D) wherein the surface of an epitaxial silicon layer 1102 (FIG. 2C), which is deposited on a porous silicon layer 200, is bonded to the surface of an insulation film 1104 (e.g., an oxide film), which is formed on a silicon substrate 1110; and the structure (FIG. 2G) where the surface of the insulation film 1103 (FIG. 2F) (e.g., an oxide film formed by thermal oxidation), which is formed on the epitaxial silicon layer 1102, is bonded to the silicon substrate 1110, the surface of which is not oxidized. In this example, the other procedures can be performed in the same manner as is shown in FIGS. 1A through 1F.

EXAMPLE 3

An example shown in FIGS. 3A through 3H will now be explained. The same reference numerals as are used in FIGS. 1A through 1F are also used to denote corresponding or identical components. The feature of this example is that a glass material, such as quartz glass or green glass, is used for a substrate 1210 (FIGS. 3D and 3G), which is to be bonded to a substrate 100 (FIGS. 3C and 3F) on which is an epitaxial silicon film 101. In this example are shown a mode (FIG. 3D) where the epitaxial silicon layer 1102 (FIG. 3C) is bonded to the glass substrate 1210, and a mode (FIG. 3F) where the insulation film 1103 (e.g., an oxide film obtained by thermal oxidation), which is formed on the epitaxial silicon layer 1102, is bonded to the glass substrate 1210. In this example, the other procedures can be performed in the same manner as is shown in FIGS. 1A through 1F.

An example for forming a diffusion layer on both sides of a single crystal silicon substrate will be explained.

EXAMPLE 4

This example will be explained while referring to FIGS. 4A through 4F and 5A through 5F.

Figure 4A:
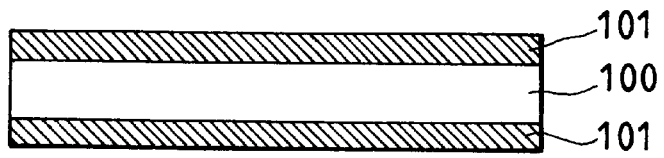
FIGS. 4A through 4F are diagrams illustrating a further example of the method according to the present invention for the fabrication of a semiconductor substrate.

In this example, first, a diffusion layer (e.g., a +P-type layer) 101 is formed on a first surface of a single crystal silicon substrate 100, and on a second surface that is located on the reverse side (FIG. 4A).

Figure 4B:
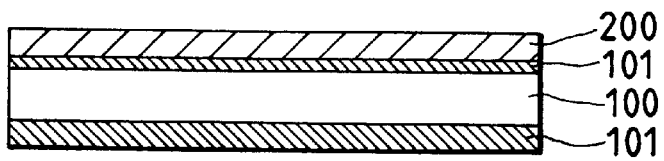
Figure 4C:
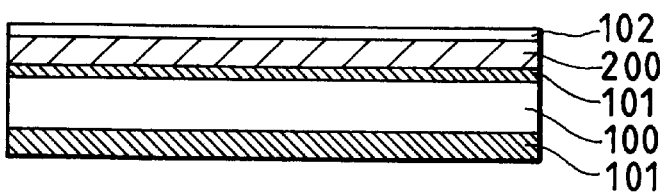
Figure 4D:
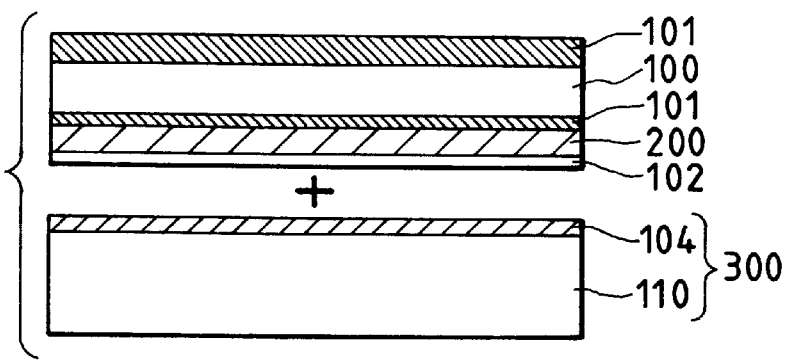
Figure 4E:
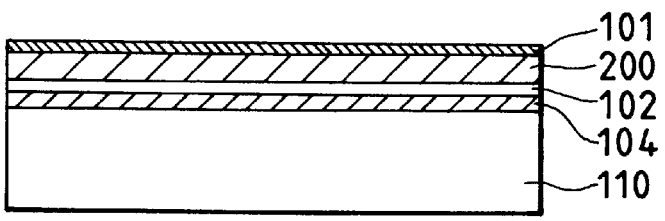
Figure 4F:
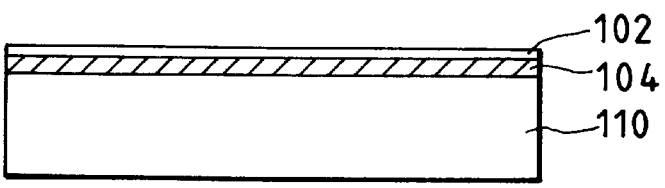
Figure 5A:
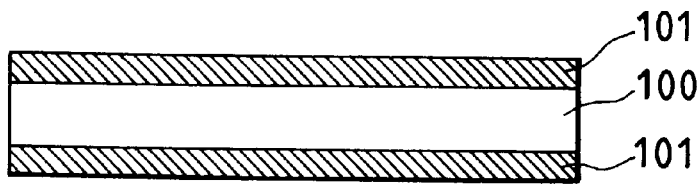
FIGS. 5A through 5F are diagrams illustrating still another example of the method according to the present invention for the fabrication of a semiconductor substrate.
Figure 5B:
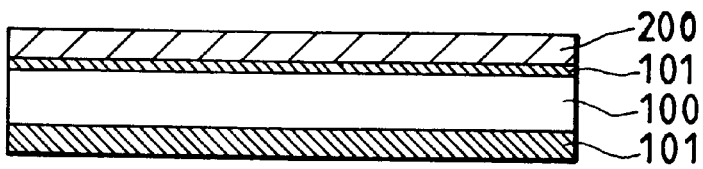
Figure 5C:
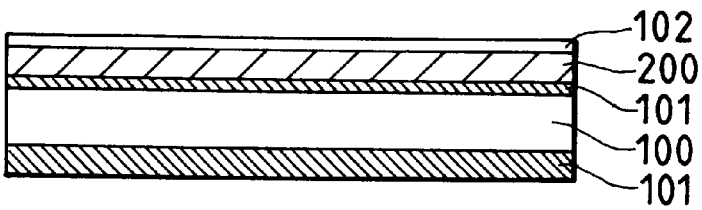
Figure 5D:
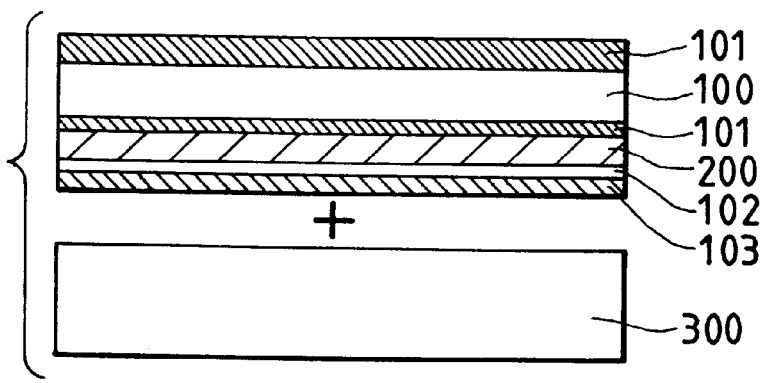
Figure 5E:
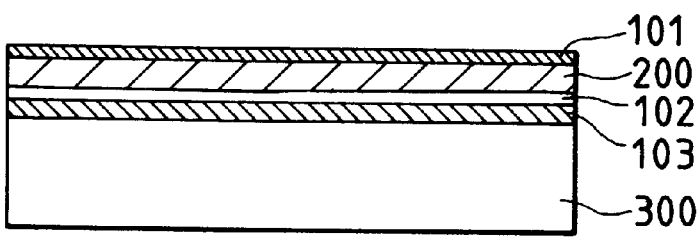
Figure 5F:
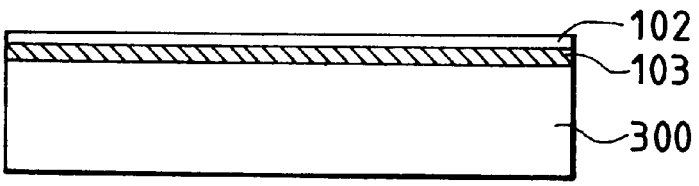

Then, the diffusion layer 101 on one side is altered and made porous to provide a porous layer 200 (FIG. 4B). The porous layer 200 may be provided by altering the entire region of the diffusion layer 101, or by maintaining the diffusion layer 101 when it is altered and is made porous, as is shown in FIG. 4B. Sequentially, a single crystal semiconductor layer 102 is formed on the porous layer 200 (FIG. 4C). The single crystal semiconductor layer 102 can be formed of silicon, and can also be formed of a compound semiconductor material, such as the II-VI family or the III-V family. The surface of the single crystal semiconductor layer 102 is bonded to a base substrate 300 (FIG. 4D). The base substrate 300 may be provided by forming an insulation layer 104 on a silicon substrate 110, or may be formed of a sole transmission glass substrate, a non-transmission sole insulation member, or a lamination of them. In short, the base substrate 300 need only be a substrate on the surface of which is formed an insulation material. The specific bonding means employed is anode bonding, pressurization, heating, or a combination of them. The diffusion layer 101, the silicon substrate 100 and the porous layer 200 are removed from the resultant bonded structure (FIG. 4E). For this removal, not only a mechanical method such as grinding but also a chemical method such as etching can be adopted.

The same reference numerals as are used in FIGS. 4A through 4F are also used in FIGS. 5A through 5F to denote corresponding or identical components, and no detailed explanation for them will be given. An example shown in FIGS. 5A through 5F differs from the example shown in FIGS. 4A through 4F only in that, in FIG. 5D, an insulation layer 103 is formed on a single crystal semiconductor layer 102 and the insulation layer 103 is bonded with a base substrate 300. In this example, the base substrate 300 can be a sole silicon substrate or a sole glass substrate, or a structure wherein a film or a substrate are laminated on such a substrate.

In this example, a diffusion layer can be formed in the same manner as is explained while referring to FIGS. 1A through 1F. In addition, the various procedures described in the example wherein a diffusion layer is formed on one side of a silicon substrate can be adopted in this example.

This example, wherein diffusion layers are formed on both sides of the substrate, provides effects for reducing contact resistance at the time anodization is performed and for reducing bending at the time of formation of diffusion layers are formed.

The preferred embodiments of the present invention will now be described in detail. The present invention, however, is not limited to these embodiments.

(First Embodiment)

A single crystal Si substrate, the resistance of which was not specified, was prepared. A $P^+$ high-density layer of 5 µm was formed on a first surface of the silicon substrate by using a diffusion method.

The formation of the $P^+$ high-density layer by using the diffusion method was performed as follows. A solvent in which $B_2O_3$ was contained was coated on the main surface of the Si substrate by using spin coating. Then, the substrate was annealed at 140° C. and the solvent was evaporated. The resultant structure was placed in a diffusion furnace for six hours, while the temperature of the core tube of the furnace was maintained at 1200° C. So-called drive-in was performed on the substrate to form a $P^+$ high-density layer.

The Si substrate on which the $P^+$ high-density layer was formed was immersed in a HF solution. The first surface was anodized and a porous layer was formed on the first surface. The conditions for the anodization were:

Current density: 7 (mA·cm$^{-2}$)

Anodization solution: HF:$H_2O$:$C_2H_5OH$=1:1:1

Time: 11 (min)

Thickness of porous Si: 12 (µm).

Then, oxidation of the substrate, on which the porous layer was formed, was performed for one hour in an oxygen atmosphere at a temperature of 400° C. Through oxidation, the interior walls of the pores of the porous Si layer were covered with a thermal oxide film. Sequentially, a single crystal Si layer of 0.2 µm was epitaxially grown on the porous Si layer by using the CVD (Chemical Vapor Deposition) method. The conditions for the growth were:

Source gas: $SiH_2Cl_2$/$H_2$

Gas flow rate: 0.5/180 (l/min)

Gas pressure: 80 (Torr)

Temperature: 950 (° C.)

Growth speed: 0.3 (µm/min).

An $SiO_2$ layer of 50 nm was formed on the surface of the epitaxial Si layer by thermal oxidation.

The surface of the $SiO_2$ layer and the surface of a second Si substrate, on which an $SiO_2$ layer of 500 nm was formed, were exactly aligned and brought into contact, and the resultant structure was bonded by heating it for two hours at a temperature of 900° C. As a result, the bonded substrate could be acquired.

The surface of the bonded substrate on which the $P^+$ layer was formed was ground to remove the $P^+$ layer and the non-porous single crystal Si region, so that the porous Si layer was fully exposed.

Then, the exposed porous Si layer was selectively etched by using a solution of 49% hydrogen fluoride and 30% peroxide. No etching of the single crystal Si layer occurred. And while the single crystal Si layer was used as an etching stopper, the porous Si layer was completely removed by selective etching.

The etching speed for the non-porous Si single crystal relative to the etching solution was extremely low. A ratio of this speed to the selective etching speed for the porous layer was five powers of ten or greater, and the amount of etching performed on the non-porous layer was so small (several nm) that it could be practically disregarded.

Through the series of the procedures, the single crystal Si layer of 0.2 µm was formed on the Si oxide film, and a so-called SOI substrate could be acquired. When the cross section of the SOI substrate was observed by using a transmission electron microscope, it was confirmed that no new crystal defects were introduced into the single crystal Si layer, and a preferable crystal structure was maintained.

(Second Embodiment)

A spin coating film of $B_2O_3$ was deposited on the obverse and the reverse surfaces of an Si substrate, and a diffused region was formed. An SOI substrate was fabricated in the same manner as was one in the first embodiment. When the obtained SOI substrate was observed in the same manner as in the first embodiment, it was confirmed that the single crystal Si thin film was of good quality and had extremely few crystal defects.

(Third Embodiment)

Spin coating films were formed on Si substrates by using a paste that was acquired by adding an organic binder and a solvent to $B_2O_3$, and ten of the Si substrates were arranged in a diffusion furnace to form diffused regions thereon. Except for the number of substrates, the same processes were performed as were performed to fabricate an SOI substrate in the first embodiment.

In this embodiment, diffusion layers were formed on both sides of the silicon substrates by the vaporous diffusion of the $B_2O_3$ films on adjacent silicon substrates. It was confirmed that the SOI substrates obtained in this embodiment were also of good quality and had extremely few crystal defects.

(Fourth Embodiment)

A single crystal Si substrate, the resistance of which was not specified, was prepared. By using a diffusion method, a $P^+$ high-density layer of 5 µm was formed on the first surface and on the reverse surface of the silicon substrate.

The formation of the $P^+$ high-density layers by using the diffusion method was performed as follows. The Si substrate was placed in a furnace core tube and bubbling was induced by introducing $N_2$ gas into a liquid diffusion source that contained $BBr_3$. The vaporized material was introduced into the furnace core tube with a carrier gas ($N_2$+$O_2$). A $B_2O_3$ layer was formed by maintaining the temperature of the furnace core tube at 1050° C. for one hour. Then, while the temperature of the core tube of the furnace was maintained at 1200° C., a so-called drive-in was performed on the substrate to form $P^+$ high-density layers.

The Si substrate on which were formed the $P^+$ high-density layers was immersed in an HF solution. The first surface was anodized, and a porous layer was formed thereon. The conditions for the anodization were:

Current density: 7 (mA·cm$^{-2}$)

Anodization solution: HF:$H_2O$:$C_2H_5OH$=1:1:1

Time: 11 (min)

Thickness of porous Si: 12 (µm).

Then, oxidation of the substrate, on which the porous layer was formed, was performed for one hour in an oxygen atmosphere at a temperature of 400° C. Through the oxidation, the interior walls of the pores of the porous Si layer were covered with thermal oxide film. Sequentially, a single crystal Si layer of 0.2 µm was epitaxially grown on the porous Si layer by using the CVD (Chemical Vapor Deposition) method. The conditions for the growth were:

Source gas: $SiH_2Cl_2$/$H_2$

Gas flow rate: 0.5/180 (l/min)

Gas pressure: 80 (Torr)

Temperature: 950 (° C.)

Growth speed: 0.3 (µm/min).

A $SiO_2$ layer of 50 nm was formed on the surface of the epitaxial Si layer by thermal oxidation.

The surface of the $SiO_2$ layer and the surface of a second Si substrate, on which an $SiO_2$ layer of 500 nm was formed, were exactly aligned and brought into contact, and the resultant structure was bonded by heating it for two hours at a temperature of 900° C. As a result, the bonded substrate could be acquired.

The surface of the bonded substrate on which the $P^+$ layer was formed was ground to remove the $P^+$ layer and the non-porous single crystal Si region, so that the porous Si layer was fully exposed.

Then, the exposed porous Si layer was selectively etched by using a solution of 49% hydrogen fluoride and 30% peroxide. No etching of the single crystal Si layer occurred. And while the single crystal Si layer was used as an etching stopper, the porous Si layer was completely removed by selective etching.

The etching speed for the non-porous Si single crystal relative to the etching solution was extremely low. A ratio of this speed to the selective etching speed for the porous layer was five powers of ten or greater, and the amount of etching performed on the non-porous layer was so small (several nm) that it could be practically disregarded.

Through the series of procedures, the single crystal Si layer of 0.2 μm was formed on the Si oxide film, and a so-called SOI substrate could be acquired. When the cross section of the SOI substrate was observed by using a transmission electron microscope, it was confirmed that no new crystal defects were introduced into the single crystal Si layer, and that a preferable crystal structure was maintained.

In this embodiment, since the $P^+$ layer was formed on both sides of the substrate, contact resistance could be reduced at the time of the formation of the porous layer, and the bending that accompanied the formation of the $P^+$ layer could also be reduced. As a result, the substrates could be very stably bonded and the SOI substrate could be acquired.

(Fifth Embodiment)

In this embodiment, a process for fabricating a semiconductor substrate was performed in the same manner as in the fourth embodiment, except for the changed conditions described in (i) through (iii).

(i) The conditions for the anodization were:
  Current density: 5 ($mA \cdot cm^{-2}$)
  Anodization solution: $HF:H_2O:C_2H_5OH=1:1:1$
  Time: 12 (min)
  Thickness of porous Si: 10 (μm).

(ii) A single crystal GaAs layer of 1 μm was epitaxially grown on the porous Si layer by using the MOCVD (Metal Organic Chemical Vapor Deposition) method. The conditions for the growth were:
  Source gas: $TMG/AsH_3/H_2$
  Gas pressure: 80 (Torr)
  Temperature: 700 (° C.)

(iii) The surface of the GaAs layer and the surface of another Si substrate, on which an $SiO_2$ layer of 500 nm was formed, were exactly aligned and were brought into contact, and the resultant structure was bonded by heating it for two hours at a temperature of 700° C.

In this manner, a substrate could be acquired where the single crystal GaAs layer of 1 μm was formed on the Si oxide film. When the cross section of the resulting substrate was observed by using a transmission electron microscope, it was confirmed that no new crystal defects were introduced into the single crystal GaAs layer, and that a preferable crystal structure was maintained.

In this embodiment, also, bending in consonance with the formation of a $P^+$ layer could be reduced and the SOI substrate could be very stably fabricated.

(Sixth Embodiment)

A process for fabricating a SOI substrate was performed in the same manner as in the fourth embodiment, except for the changed conditions described in (i) and (ii).

(i) The conditions for the anodization were:
  Current density: 5 ($mA \cdot cm^{-2}$)
  Anodization solution: $HF:H_2O:C_2H_5OH=1:1:1$
  Time: 12 (min)
  Thickness of porous Si: 10 (μm).

(ii) A single crystal Si layer of 0.2 μm was epitaxially grown on the porous Si layer by using the CVD (Chemical Vapor Deposition) method. The conditions for the growth were:
  Source gas: $SiH_2Cl_2/H_2$
  Gas flow rate: 0.25/230 (l/min)
  Gas pressure: 760 (Torr)
  Temperature: 1040 (° C.)
  Growth speed: 0.14 (μm/min)

A SOI substrate was acquired where the single crystal Si layer of 0.2 μm was formed on the Si oxide film.

When the cross section of the resulting substrate was observed by using a transmission electron microscope, it was confirmed that no new crystal defects were introduced into the single crystal Si layer, and that a preferable crystal structure was maintained.

(Seventh Embodiment)

A method for fabricating a semiconductor substrate was performed in the same manner as in the fourth embodiment, except for the changed conditions described in (i) through (iv).

(i) The thickness of a $P^+$ high-density layer that was formed by a diffusion method was 10 μm.

(ii) The conditions for the anodization were:
  Current density: 5 ($Am \cdot cm^{-2}$)
  Anodization solution: $HF:H_2O:C_2H_5OH=1:1:1$
  Time: 12 (min)
  Thickness of porous Si: 10 (μm).

(iii) A single crystal Si layer of 0.2 μm was epitaxially grown on the porous Si layer by using the CVD (Chemical Vapor Deposition) method. The conditions for the growth were:
  Source gas: $SiH_2Cl_2/H_2$
  Gas flow rate: 0.4/230 (l/min)
  Gas pressure: 80 (Torr)
  Temperature: 900 (° C.)
  Growth speed: 0.13 (μm/min)

(iv) When a $SiO_2$ layer of 50 nm was formed on the surface of the epitaxial Si layer by thermal oxidation, the surface of the $SiO_2$ layer and the surface of a quartz substrate that was separately prepared were aligned, and the substrates were bonded together by alternately performing thin film formation and a thermal process (at the highest temperature of 400° C.).

In this manner, a semiconductor substrate could be acquired where a single crystal Si layer of 0.2 μm was formed on the Si oxide film.

When the cross section of the resulting substrate was observed by using a transmission electron microscope, it was confirmed that no new crystal defects were introduced into the single crystal Si layer, and that a preferable crystal structure was maintained.

(Eighth Embodiment)

A semiconductor substrate was fabricated in the same manner as in the fifth embodiment, except that the surface of a GaAs layer and the surface of a quartz substrate that was separately prepared were aligned, and the substrates were bonded together by alternately performing a thin film formation and a thermal process (at a highest temperature of 400° C.). In this embodiment, as in the fifth embodiment, a substrate on which an excellent crystalline semiconductor layer was provided could be acquired.

(Ninth Embodiment)

A method for fabricating a semiconductor substrate was performed in the same manner as in the fourth embodiment, except for the changed conditions described in (i) and (ii).

(i) The conditions for the anodization were:
Current density: 5 ($mA \cdot cm^{-2}$)
Anodization solution: $HF:H_2O:C_2H_5OH=1:1:1$
Time: 12 (min)
Thickness of porous Si: 10 ($\mu$m).

(ii) When a $SiO_2$ layer of 50 nm was formed on the surface of the epitaxial Si layer by thermal oxidation, the surface of the $SiO_2$ layer and the surface of a quartz substrate that was separately prepared were aligned, and the substrates were bonded together by alternately performing a thin film formation and a thermal process (at a highest temperature of 400° C.). In this embodiment, as in the fourth embodiment, a substrate on which an excellent crystalline semiconductor layer was provided could be acquired.

(Tenth Embodiment)

A method for fabricating a semiconductor substrate was performed in the same manner as in the fourth embodiment, except for the changed conditions described in (i) through (iii).

(i) A reproduced single crystal Si substrate was employed.

(ii) The thickness of a $P^+$ high-density layer that was formed by a diffusion method was 10 $\mu$m.

(iii) A single crystal Si layer of 0.2 $\mu$m was epitaxially grown on a porous Si layer by using the CVD (Chemical Vapor Deposition) method. The conditions for the growth were:
Source gas: $SiH_2Cl_2/H_2$
Gas flow rate: 0.25/230 (l/min)
Gas pressure: 760 (Torr)
Temperature: 1040 (° C.)
Growth speed: 0.14 ($\mu$m/min)

In this embodiment, as in the fourth embodiment, a substrate on which an excellent crystalline semiconductor layer was provided could be acquired.

(Eleventh Embodiment)

A process for fabricating a semiconductor substrate was performed in the same manner as in the fifth embodiment, except that a reproduced single crystal Si substrate was employed and a $P^+$ high-density layer was formed thereon. In this embodiment, as in the fifth embodiment, a substrate on which an excellent crystalline semiconductor layer was provided could be acquired.

(Twelfth Embodiment)

A process for fabricating a semiconductor substrate was performed in the same manner as in the sixth embodiment, except that a reproduced single crystal Si substrate was employed and a $P^+$ high-density layer was formed thereon. In this embodiment, as in the sixth embodiment, a substrate on which an excellent crystalline semiconductor layer was provided could be acquired.

(Thirteenth Embodiment)

A fabrication process for a semiconductor substrate was performed in the same manner as was the one in the ninth embodiment, except that a reproduced single crystal Si substrate was employed and a $P^+$ high-density layer was formed thereon. In this embodiment, as in the ninth embodiment, a substrate on which an excellent crystalline semiconductor layer was provided could be acquired.

(Fourteenth Embodiment)

A process for fabricating a semiconductor substrate was performed in the same manner as was the one in the eighth embodiment, except that a reproduced single crystal Si substrate was employed and a $P^+$ high-density layer was formed thereon. In this embodiment, as in the eighth embodiment, a substrate on which an excellent crystalline semiconductor layer was provided could be acquired.

(Fifteenth Embodiment)

The conditions for forming a single crystal Si layer on a porous Si layer by the CVD (Chemical Vapor Deposition) were set as follows:
Source gas: $SiH_2Cl_2/H_2$
Gas flow rate: 0.25/230 (l/min)
Gas pressure: 760 (Torr)
Temperature: 1040 (° C.)
Growth speed: 0.14 ($\mu$m/min).

Except for these conditions, a fabrication process for fabricating a semiconductor substrate was performed in the same manner as in the thirteenth embodiment. In this embodiment, as in the thirteenth embodiment, a substrate on which an excellent crystalline semiconductor layer was provided could be acquired.

(Sixteenth Embodiment)

A process for fabricating a SOI substrate was performed in the same manner as in the fourth embodiment, except that instead of forming a $SiO_2$ layer on the surface of an epitaxial Si layer, the epitaxial Si layer was bonded to another Si substrate on which a $SiO_2$ layer was formed. In this embodiment also, an excellent crystalline SOI substrate could be acquired.

(Seventeenth Embodiment)

A process for fabricating a SOI substrate was performed in the same manner as in the fourth embodiment, except that a $SiO_2$ layer, which was formed by thermally oxidizing an epitaxial Si layer, was bonded to another Si substrate on which a $SiO_2$ layer was not formed. In this embodiment also, an excellent crystalline SOI substrate could be acquired.

(Eighteenth Embodiment).

(1) First, a $P^+$ diffusion layer was formed in a silicon wafer by using the method shown in the first embodiment.

(2) In a solution where 49% HF and ether alcohol were mixed at a ratio of 2:1, the silicon wafer was positioned as an anode and a platinum disk of 5-inch diameter was positioned as a cathode, opposite the silicon wafer. The reverse surface of the silicon wafer was coated so as not to be conductive with the platinum via the solution, while the side and the end surfaces of the silicon wafer were coated so that the entire obverse surface became conductive with the platinum via the solution. A current of 10 $mA/cm^2$ was supplied for 9 minutes between the silicon wafer and the platinum. As a result, the silicon wafer was anodized and a porous silicon layer of 12 $\mu$m was formed on the obverse surface. The wafer on which the porous layer was formed was extracted from the solution and the porosity was measured. The porosity was about 20%.

(3) Subsequently, oxidation of the wafer, on which the porous silicon layer was formed, was performed for one hour in an oxygen atmosphere at a temperature of 400° C. Since only an oxide film of approximately 50 Å or less was formed during the oxidation process, an silicon oxide film was formed only on the surface of the porous silicon layer and the side walls of the pores, and a single crystal silicon region was maintained internally.

(4) The wafer was immersed for 30 seconds in an HF solution that was diluted to 1.25%, and was then washed to remove the extremely thin silicon oxide film that had been formed on the porous surface.

(5) The wafer was placed in a CVD growth furnace, and the thermal processes were continuously performed under the following conditions.

a) Temperature: 1120 (° C.)
Pressure: 80 (Torr)
Gas: H2; 230 (l/min)
Time: 7.5 (min)
b) Temperature: 900 (° C.)
Pressure: 80 (Torr)
Gas: H2/SiH$_2$Cl$_2$; 230/0.4 (l/min)

Through the oxidation processing, a single crystal silicon layer of about 0.29 μm was formed.

(6) The wafer was exposed at 900° C. in an atmosphere wherein oxygen and hydrogen were mixed, and the single crystal silicon layer was oxidized to form silicon oxide film of 200 nm.

(7) The resultant wafer and a second Si wafer were washed with a medical solution that is used in a common semiconductor fabrication process. The wafers were then dipped in a diluted HF solution for a final medical washing, rinsed with pure water, and dried. Then, the surfaces of the two wafers were slowly aligned, brought into contact and bonded together. Following this, a thermal process was performed on the resultant structure at a temperature of 1180° C., 5 min.

(8) Then, the reverse face of the wafer on which a porous silicon layer was formed was ground and the porous silicon layer was exposed across the entire surface of the substrate. The wafer was then immersed for two hours in a solution of HF and H$_2$O$_2$. The porous silicon layer was removed by etching, and an epitaxial silicon layer of approximately 0.2 μm was formed on the second substrate via the silicon oxide film.

(9) A thermal process was performed on this substrate for four hours at a temperature of 1100° C. in a 100% hydrogen atmosphere.

(10) When the surface of the epitaxial silicon layer was thoroughly observed by using a Nomarski differential interference optical microscope, it was confirmed that a SOI substrate that had extremely few crystal defects was acquired.

(Nineteenth Embodiment)

In the same manner as in the first embodiment, a spin coating film was formed on a first surface of a single crystal Si substrate, followed by baking. The resulting wafer was then placed in a furnace core tube to form a diffusion layer on the reverse surface of the substrate in the same manner as in the fourth embodiment. Subsequently, the same processes as in the fourth embodiment were performed to fabricate an SOI substrate. The obtained SOI structure had a good crystallinity.

What is claimed is:

1. A method for fabricating a semiconductor article comprising the steps of:

employing a diffusion method to diffuse, in a whole surface of a silicon substrate, an element, which is capable of controlling a conductive type, and to form a diffused region;

forming a porous layer in said diffused region;

forming a non-porous single crystal layer on said porous layer;

bonding said non-porous single crystal layer to a base substrate, while an insulation layer is provided at least either on a surface to be bonded of said non-porous single crystal layer or on a surface to be bonded of said base substrate; and removing said porous layer.

2. A method for fabricating a semiconductor article according to claim 1, wherein said element that is capable of controlling said conductive type is an element that is capable of controlling a conductive N-type of silicon.

3. A method for fabricating a semiconductor article according to claim 2, wherein said element that is capable of controlling said conductive type is selected from a group consisting of P, As and Sb.

4. A method for fabricating a semiconductor article according to claim 1, wherein said element that is capable of controlling said conductive type is an element that is capable of controlling a conductive P-type of silicon.

5. A method for fabricating a semiconductor article according to claim 4, wherein said element that is capable of controlling said conductive type is B.

6. A method for fabricating a semiconductor article according to claim 1, wherein said diffusion method is a process for thermally diffusing said element in said silicon substrate.

7. A method for fabricating a semiconductor article according to claim 5, wherein said element that is capable of controlling said conductive type is supplied while a gas is used as a source.

8. A method for fabricating a semiconductor article according to claim 7, wherein said gas is B$_2$H$_6$.

9. A method for fabricating a semiconductor article according to claim 5, wherein said element that is capable of controlling said conductive type is supplied while a liquid is used as a source.

10. A method for fabricating a semiconductor article according to claim 9, wherein said liquid is BBr$_3$.

11. A method for fabricating a semiconductor article according to claim 5, wherein said element that is capable of controlling said conductive type is supplied while a solid is used as a source.

12. A method for fabricating a semiconductor article according to claim 11, wherein said solid is B$_2$O$_3$.

13. A method for fabricating a semiconductor article according to claim 5, wherein said element that is capable of controlling said conductive type is supplied from a solid material formed on said silicon substrate.

14. A method for fabricating a semiconductor article according to claim 13, wherein said solid material is selected from CVD film, BSG and spin coated film.

15. A method for fabricating a semiconductor article according to claim 1, wherein a concentration of said element that is capable of controlling said conductive type and that is contained in said diffusion region is so adjusted that said concentration lies within a range of from $5.0 \times 10^{16}$/cm$^3$ to $5.0 \times 10^{20}$ cm$^3$.

16. A method for fabricating a semiconductor article according to claim 15, wherein said concentration of said element that is capable of controlling said conductive type and that is contained in said diffusion region is so adjusted that said concentration lies within a range of from $1.0 \times 10^{17}$/cm$^3$ to $2.0 \times 10^{20}$ cm$^3$.

17. A method for fabricating a semiconductor article according to claim 16, wherein said concentration of said element that is capable of controlling said conductive type and that is contained in said diffusion region is so adjusted that said concentration lies within a range of from $5.0 \times 10^{17}$/cm$^3$ to $1.0 \times 10^{20}$ cm$^3$.

18. A method for fabricating a semiconductor article according to claim 1, wherein a thickness of said diffusion region is 500 Å or greater.

19. A method for fabricating a semiconductor article according to claim 1, wherein porosity of said porous layer is so controlled that said porosity is 50% or lower.

20. A method for fabricating a semiconductor article according to claim 19, wherein said porosity of said porous layer is so controlled that said porosity lies in a range of from 1% to 40%.

21. A method for fabricating a semiconductor article according to claim 20, wherein said porosity of said porous layer is so controlled that said porosity lies in a range of from 5% to 30%.

22. A method for fabricating a semiconductor article according to claim 1, wherein said non-porous single crystal layer is a single crystal Si layer.

23. A method for fabricating a semiconductor article according to claim 1, wherein said non-porous single crystal layer is a single crystal compound semiconductor layer.

24. A method for fabricating a semiconductor article according to claim 22, wherein said insulation layer is selected from the group consisting of a thermal oxide film, a deposited $SiO_2$ film and a deposited $Si_3N_4$ film.

25. A method for fabricating a semiconductor article according to claim 24, wherein said insulation layer is formed on a side of said non7porous single crystal layer.

26. A method for fabricating a semiconductor article according to claim 24, wherein said insulation layer is formed by thermally oxidizing a surface of said single crystal silicon layer.

27. A method for fabricating a semiconductor article according to claim 1, wherein said base substrate is a single crystal silicon substrate.

28. A method for fabricating a semiconductor article according to claim 27, wherein an oxide layer is formed on a face of said base substrate that is to be bonded.

29. A method for fabricating a semiconductor article according to claim 27, wherein said face of said base substrate that is to be bonded is formed of single crystal silicon.

30. A method for fabricating a semiconductor article according to claim 1, wherein said base substrate is made of glass.

31. A method for fabricating a semiconductor article according to claim 24, wherein said insulation layer is formed on a side of said base substrate.

32. A method for fabricating a semiconductor article according to claim 31, wherein said insulation layer is formed by thermally oxidizing a single crystal silicon substrate.

33. A method for fabricating a semiconductor article according to claim 31, wherein said insulation layer constitutes a glass substrate.

34. A method for fabricating a semiconductor article according to claim 31, wherein bonding is performed without said insulation layer being formed on said non-porous single crystal layer.

35. A method for fabricating a semiconductor article according to claim 22, wherein said nonporous silicon layer is formed by epitaxial growth after interior walls of pores of said porous layer are oxidized.

36. A method for fabricating a semiconductor article according to claim 35, wherein said nonporous silicon layer is formed by epitaxial growth after a thermal process is performed on said porous layer in a hydrogen atmosphere.

37. A method for fabricating a semiconductor article according to claim 1, wherein said porous layer is removed by using hydrogen fluoride, a mixture of hydrogen fluoride and, at least, either alcohol or hydrogen peroxide, buffered hydrogen fluoride, or a mixture of buffered hydrogen fluoride and, at least, either alcohol or hydrogen peroxide.

38. A method for fabricating a semiconductor article according to claim 1, wherein a thermal process is performed in a hydrogen atmosphere after said porous layer is removed.

39. A method for fabricating a semiconductor article comprising the steps of:

employing a diffusion method to diffuse an element, which is capable of controlling a conductive type, in a first whole surface of a silicon substrate and in a second whole surface on a reverse side of said first surface, to form a diffused region;

forming a porous layer in said diffused region that is formed on said first surface;

forming a non-porous single crystal layer on said porous layer;

bonding said non-porous single crystal layer and a base substrate, while an insulation layer is provided at least either on a surface to be bonded of said non-porous single crystal layer or on a surface to be bonded of said base substrate; and removing said porous layer.

40. A method for fabricating a semiconductor article according to claim 39, wherein said element that is capable of controlling said conductive type is an element that is capable of controlling a conductive N-type of silicon.

41. A method for fabricating a semiconductor article according to claim 40, wherein said element that is capable of controlling said conductive type is selected from a group consisting of P, As and Sb.

42. A method for fabricating a semiconductor article according to claim 39, wherein said element that is capable of controlling said conductive type is an element that is capable of controlling a conductive P-type of silicon.

43. A method for fabricating a semiconductor article according to claim 42, wherein said element that is capable of controlling said conductive type is B.

44. A method for fabricating a semiconductor article according to claim 39, wherein said diffusion method is a process for thermally diffusing said element in said silicon substrate.

45. A method for fabricating a semiconductor article according to claim 43, wherein said element that is capable of controlling said conductive type is supplied while a gas is used as a source.

46. A method for fabricating a semiconductor article according to claim 45, wherein said gas is $B_2H_6$.

47. A method for fabricating a semiconductor article according to claim 43, wherein said element that is capable of controlling said conductive type is supplied while a liquid is used as a source.

48. A method for fabricating a semiconductor article according to claim 47, wherein said liquid is $BBr_3$.

49. A method for fabricating a semiconductor article according to claim 43, wherein said element that is capable of controlling said conductive type is supplied while a solid is used as a source.

50. A method for fabricating a semiconductor article according to claim 49, wherein said solid is $B_2O_3$.

51. A method for fabricating a semiconductor article according to claim 43, wherein said element that is capable of controlling said conductive type is supplied from a solid material formed on said silicon substrate.

52. A method for fabricating a semiconductor article according to claim 51, wherein said solid material is selected from CVD film, BSG and spin coated film.

53. A method for fabricating a semiconductor article according to claim 39, wherein a concentration of said element that is capable of controlling said conductive type and that is contained in said diffusion region is so adjusted that said concentration lies within a range of from $5.0 \times 10^{16}/\text{cm}^3$ to $5.0 \times 10^{20}/\text{cm}^3$.

54. A method for fabricating a semiconductor article according to claim 53, wherein said concentration of said element that is capable of controlling said conductive type and that is contained in said diffusion region is so adjusted that said concentration lies within a range of from $1.0 \times 10^{17}/\text{cm}^3$ to $2.0 \times 10^{20}/\text{cm}^3$.

55. A method for fabricating a semiconductor article according to claim 54, wherein said concentration of said element that is capable of controlling said conductive type and that is contained in said diffusion region is so adjusted that said concentration lies within a range of from $5.0 \times 10^{17}/\text{cm}^3$ to $1.0 \times 10^{20}/\text{cm}^3$.

56. A method for fabricating a semiconductor article according to claim 39, wherein a thickness of said diffusion region is 500 Å greater.

57. A method for fabricating a semiconductor article according to claim 39, wherein porosity of said porous layer is so controlled that said porosity is 50% or lower.

58. A method for fabricating a semiconductor article according to claim 57, wherein said porosity of said porous layer is so controlled that said porosity lies in a range of from 1% to 40%.

59. A method for fabricating a semiconductor article according to claim 58, wherein said porosity of said porous layer is so controlled that said porosity lies in a range of from 5% to 30%.

60. A method for fabricating a semiconductor article according to claim 39, wherein said nonporous single crystal layer is a single crystal Si layer.

61. A method for fabricating a semiconductor article according to claim 39, wherein said nonporous single crystal layer is a single crystal compound semiconductor layer.

62. A method for fabricating a semiconductor article according to claim 60, wherein said insulation layer is selected from the group consisting of a thermal oxide f film, a deposited $SiO_2$ film and a deposited $Si_3N_4$, film.

63. A method for fabricating a semiconductor article according to claim 62, wherein said insulation layer is formed on a side of said non-porous single crystal layer.

64. A method for fabricating a semiconductor article according to claim 62, wherein said insulation layer is formed by thermally oxidizing a surface of said single crystal silicon layer.

65. A method for fabricating a semiconductor article according to claim 39, wherein said base substrate is a single crystal silicon substrate.

66. A method for fabricating a semiconductor article according to claim 65, wherein an oxide layer is formed on a face of said base substrate that is to be bonded.

67. A method for fabricating a semiconductor article according to claim 65, wherein said face of said base substrate that is to be bonded is formed of single crystal silicon.

68. A method for fabricating a semiconductor article according to claim 39, wherein said base substrate is made of glass.

69. A method for fabricating a semiconductor article according to claim 62, wherein said insulation layer is formed on a side of said base substrate.

70. A method for fabricating a semiconductor article according to claim 69, wherein said insulation layer is formed by thermally oxidizing a single crystal silicon substrate.

71. A method for fabricating a semiconductor article according to claim 69, wherein said insulation layer constitutes a glass substrate.

72. A method for fabricating a semiconductor article according to claim 69, wherein bonding is performed without said insulation layer being formed on said non-porous single crystal layer.

73. A method for fabricating a semiconductor article according to claim 60, wherein said nonporous silicon layer is formed by epitaxial growth after interior walls of pores of said porous layer are oxidized.

74. A method for fabricating a semiconductor article according to claim 73, wherein said non porous silicon layer is formed by epitaxial growth after a thermal process is performed on said porous layer in a hydrogen atmosphere.

75. A method for fabricating a semiconductor article according to claim 39, wherein said porous layer is removed by using hydrogen fluoride, a mixture of hydrogen fluoride and, at least, either alcohol or hydrogen peroxide, buffered hydrogen fluoride, or a mixture of buffered hydrogen fluoride and, at least, either alcohol or hydrogen peroxide.

76. A method for fabricating a semiconductor article according to claim 39, wherein a thermal process is performed in a hydrogen atmosphere after said porous layer is removed.

77. A method for fabricating a semiconductor article according to claim 39, wherein a plurality of silicon substrates, each of which has said solid material formed on said first surface, are arranged and heated in a furnace to form said diffused region on said first surface and on said second surface of each of said plurality of substrates.

78. A method for fabricating a semiconductor article comprising the steps of:

employing a diffusion method to diffuse, in a whole surface of a silicon substrate, an element, which is capable of controlling a conductive type, to form a diffused region;

forming a porous layer in said diffused region;

forming a non-porous single crystal layer on said porous layer;

bonding said non-porous single crystal layer to a glass base substrate; and removing said porous layer.

79. A method for fabricating a semiconductor article according to claim 78, wherein said element that is capable of controlling said conductive type is an element that is capable of controlling a conductive N-type of silicon.

80. A method for fabricating a semiconductor article according to claim 79, wherein said element that is capable of controlling said conductive type is selected from a group consisting of P, As and Sb.

81. A method for fabricating a semiconductor article according to claim 78, wherein said element that is capable of controlling said conductive type is an element that is capable of controlling a conductive P-type of silicon.

82. A method for fabricating a semiconductor article according to claim 81, wherein said element that is capable of controlling said conductive type is B.

83. A method for fabricating a semiconductor article according to claim 78, wherein said diffusion method is a process for thermally diffusing said element in said silicon substrate.

84. A method for fabricating a semiconductor article according to claim 82, wherein said element that is capable of controlling said conductive type is supplied while a gas is used as a source.

85. A method for fabricating a semiconductor article according to claim 84, wherein said gas is $B_2H_6$.

86. A method for fabricating a semiconductor article according to claim 82, wherein said element that is capable of controlling said conductive type is supplied while a liquid is used as a source.

87. A method for fabricating a semiconductor article according to claim 86, wherein said liquid is $BBr_3$.

88. A method for fabricating a semiconductor article according to claim 82, wherein said element that is capable of controlling said conductive type is supplied while a solid is used as a source.

89. A method for fabricating a semiconductor article according to claim 88, wherein said solid is $B_2O_3$.

90. A method for fabricating a semiconductor article according to claim 82; wherein said element that is capable of controlling said conductive type is supplied from a solid material formed on said silicon substrate.

91. A method for fabricating a semiconductor article according to claim 90, wherein said solid material is selected from CVD film, BSG and spin coated film.

92. A method for fabricating a semiconductor article according to claim 78, wherein a concentration of said element that is capable of controlling said conductive type and that is contained in said diffusion region is so adjusted that said concentration lies within a range of from $5.0 \times 10^{16}$/cm$^3$ to $5.0 \times 10^{20}$/cm$^3$.

93. A method for fabricating a semiconductor article e according to claim 92, wherein said concentration of said element that is capable of controlling said conductive type and that is contained in said diffusion region is so adjusted that said concentration lies within a range of from $1.0 \times 10^{17}$/cm$^3$ to $2.0 \times 10^{20}$/cm$^3$.

94. A method for fabricating a semiconductor article according to claim 93, wherein said concentration of said element that is capable of controlling said conductive type and that is contained in said diffusion region is so adjusted that said concentration lies within a range of from $5.0 \times 10^{17}$/cm$^3$ to $1.0 \times 10^{20}$/cm$^3$.

95. A method for fabricating a semiconductor article according to claim 78, wherein a thickness of said diffusion region is 500 Å or greater.

96. A method for fabricating a semiconductor article according to claim 78, wherein porosity of said porous layer is so controlled that said porosity is 50% or lower.

97. A method for fabricating a semiconductor article according to claim 96, wherein said porosity of said porous layer is so controlled that said porosity lies in a range of from 1% to 40%.

98. A method for fabricating a semiconductor article according to claim 97, wherein said porosity of said porous layer is so controlled that said porosity lies in a range of from 5% to 30%.

99. A method for fabricating a semiconductor article according to claim 78, wherein said non-porous single crystal layer is a single crystal Si layer.

100. A method for fabricating a semiconductor article according to claim 78, wherein said non-porous single crystal layer is a single crystal compound semiconductor layer.

101. A method for fabricating a semiconductor article according to claim 78, wherein said glass base substrate is a quartz glass.

102. A method for fabricating a semiconductor article according to claim 99, wherein said non-porous silicon layer is formed by epitaxial growth after interior walls of pores of said porous layer are oxidized.

103. A method for fabricating a semiconductor article according to claim 101, wherein said non-porous silicon layer is formed by epitaxial growth after a thermal process is performed on said porous layer in a hydrogen atmosphere.

104. A method for fabricating a semiconductor article according to claim 78, wherein said porous layer is removed by using hydrogen fluoride, a mixture of hydrogen fluoride and, at least, either alcohol or hydrogen peroxide, buffered hydrogen fluoride, or a mixture of buffered hydrogen fluoride and, at least, either alcohol or hydrogen peroxide.

105. A method for fabricating a semiconductor article according to claim 78, wherein a thermal process is performed in a hydrogen atmosphere after said porous layer is removed.

106. A method for fabricating a semiconductor article comprising the steps of:
employing a diffusion method to diffuse an element, which is capable of controlling a conductive type, in a first whole surface of a silicon substrate and in a second whole surface on a reverse side of said first surface, and to form a diffused region;
forming a porous layer in said diffused region that is formed on said first surface;
forming a non-porous single crystal layer on said porous layer;
bonding said non-porous single crystal layer and a glass base substrate; and
removing said porous layer.

107. A method for fabricating a semiconductor article according to claim 106, wherein said element that is capable of controlling said conductive type is an element that is capable of controlling a conductive N-type of silicon.

108. A method for fabricating a semiconductor article according to claim 107, wherein said element that is capable of controlling said conductive type is selected from a group consisting of P, As and Sb.

109. A method for fabricating a semiconductor article according to claim 106, wherein said element that is capable of controlling said conductive type is an element that is capable of controlling a conductive P-type of silicon.

110. A method for fabricating a semiconductor article according to claim 109, wherein said element that is capable of controlling said conductive type is B.

111. A method for fabricating a semiconductor article according to claim 106, wherein said diffusion method is a process for thermally diffusing said element in said silicon substrate.

112. A method for fabricating a semiconductor article according to claim 110, wherein said element that is capable of controlling said conductive type is supplied while a gas is used as a source.

113. A method for fabricating a semiconductor article according to claim 112, wherein said gas is $B_2H_6$.

114. A method for fabricating a semiconductor article according to claim 110, wherein said element that is capable of controlling said conductive type is supplied while a liquid is used as a source.

115. A method for fabricating a semiconductor article according to claim 114, wherein said liquid is $BBr_3$.

116. A method for fabricating a semiconductor article according to claim 110, wherein said element that is capable of controlling said conductive type is supplied while a solid is used as a source.

117. A method for fabricating a semiconductor article according to claim 116, wherein said solid is $B_2O_3$.

118. A method for fabricating a semiconductor article according to claim 110, wherein said element that is capable of controlling said conductive type is supplied from a solid material formed on said silicon substrate.

119. A method for fabricating a semiconductor article according to claim 118, wherein said solid material is selected from CVD film, BSG and spin coated film.

120. A method for fabricating a semiconductor article according to claim 106, wherein a concentration of said element that is capable of controlling said conductive type and that is contained in said diffusion region is so adjusted that said concentration lies within a range of from $5.0 \times 10^{16}/\text{cm}^3$ to $5.0 \times 10^{20}/\text{cm}^3$.

121. A method for fabricating a semiconductor article according to claim 120, wherein said concentration of said element that is capable of controlling said conductive type and that is contained in said diffusion region is so adjusted that said concentration lies within a range of from $1.0 \times 10^{17}/\text{cm}^3$ to $2.0 \times 10^{20}/\text{cm}^3$.

122. A method for fabricating a semiconductor article according to claim 121, wherein said concentration of said element that is capable of controlling said conductive type and that is contained in said diffusion region is so adjusted that said concentration lies within a range of from $5.0 \times 10^{17}/\text{cm}^3$ to $1.0 \times 10^{20}/\text{cm}^3$.

123. A method for fabricating a semiconductor article according to claim 106, wherein a thickness of said diffusion region is 500 Å or greater.

124. A method for fabricating a semiconductor article according to claim 106, wherein porosity of said porous layer is so controlled that said porosity is 50% or lower.

125. A method for fabricating a semiconductor article according to claim 124, wherein said porosity of said porous layer is so controlled that said porosity lies in a range of from 1% to 40%.

126. A method for fabricating a semiconductor article according to claim 125, wherein said porosity of said porous layer is so controlled that said porosity lies in a range of from 5% to 30%.

127. A method for fabricating a semiconductor article according to claim 106, wherein said non-porous single crystal layer is a single crystal Si layer.

128. A method for fabricating a semiconductor article according to claim 106, wherein said non-porous single crystal layer is a single crystal compound semiconductor layer.

129. A method for fabricating a semiconductor article according to claim 127 wherein said non-porous silicon layer is formed by epitaxial growth after interior walls of pores of said porous layer are oxidized.

130. A method for fabricating a semiconductor article according to claim 129, wherein said non-porous silicon layer is formed by epitaxial growth after a thermal process is performed on said porous layer in a hydrogen atmosphere.

131. A method for fabricating a semiconductor article according to claim 106, wherein said porous layer is removed by using hydrogen fluoride, a mixture of hydrogen fluoride and, at least, either alcohol or hydrogen peroxide, buffered hydrogen fluoride, or a mixture of buffered hydrogen fluoride and, at least, either alcohol or hydrogen peroxide.

132. A method for fabricating a semiconductor article according to claim 106, wherein a thermal process is performed in a hydrogen atmosphere after said porous layer is removed.

133. A method for fabricating a semiconductor article according to claim 106, wherein a plurality of silicon substrates, each of which has said solid material formed on said first surface, are arranged and heated in a furnace to form said diffused region on said first surface and on said second surface of each of said plurality of substrates.

134. A method for fabricating a semiconductor article according to claim 106, wherein said glass base substrate is a quartz glass.

135. A method for fabricating a semiconductor article according claim 1, wherein said porous layer is formed in said diffused region in its entirety.

136. A method for fabricating a semiconductor article according to claim 1, wherein said porous layer is formed in a part of said diffused region.

137. A method for fabricating a semiconductor article according to claim 1, wherein said porous layer is also formed in a portion of said silicon substrate in which portion said diffused region has not been formed.

138. A method for fabricating a semiconductor article according to claim 38, wherein said porous layer is formed in said diffused region formed on said first surface in its entirety.

139. A method for fabricating a semiconductor article according to claim 38, wherein said porous layer is formed in a part of said diffused region formed on said first surface.

140. A method for fabricating a semiconductor article according to claim 38, wherein said porous layer is also formed in a portion of said silicon substrate in which portion said diffused region has not been formed.

141. A method for fabricating a semiconductor article according to claim 78, wherein said porous layer is formed in said diffused region in its entirety.

142. A method for fabricating a semiconductor article according to claim 78, wherein said porous layer is formed in a part of said diffused region.

143. A method for fabricating a semiconductor article according to claim 78, wherein said porous layer is also formed in a portion of said silicon substrate in which portion said diffused region has not been formed.

144. A method for fabricating a semiconductor article according to claim 106, wherein said porous layer is formed in said diffused region formed on said first surface in its entirety.

145. A method for fabricating a semiconductor article according to claim 106, wherein said porous layer is formed in a part of said diffused region formed on said first surface.

146. A method for fabricating a semiconductor article according to claim 106, wherein said porous layer is also formed in a portion of said silicon substrate in which portion said diffused region has not been formed.

147. A method for fabricating a semiconductor article comprising the steps of:
   forming a p-type region on a whole surface of a silicon substrate;
   forming a porous layer in said p-type region in its entirety or in a portion thereof;
   forming a non-porous single crystal layer on said porous layer;
   bonding said non-porous single crystal layer to a base substrate; and
   removing said porous layer;
   whereby said non-porous single crystal layer remains on said base substrate.

148. A method for fabricating a semiconductor article according to claim 147, wherein said non-porous single crystal layer is bonded to said base substrate with an insulation layer situated therebetween.

149. A method for fabricating a semiconductor article according to claim 147, wherein said base substrate is comprised of glass.

150. A method for fabricating a semiconductor article according to claim 148, wherein said insulation layer is formed on a surface of said non-porous single crystal layer.

151. A method for fabricating a semiconductor article according to claim 148, wherein said p-type region is formed by diffusing boron into the silicon substrate.

152. A method for fabricating a semiconductor article according to claim 151, wherein a concentration of boron contained in said p-type region is so adjusted that said concentration lies within a range of from $5.0\times10^{16}/cm^3$ to $5.0\times10^{20}/cm^3$.

153. A method for fabricating a semiconductor article according to claim 151, wherein said concentration of boron contained in said p-type region is so adjusted that said concentration lies within a range of from $1.0\times10^{17}/cm^3$ to $2.0\times10^{20}/cm$.

154. A method for fabricating a semiconductor article according to claim 151, wherein said concentration of boron contained in said p-type region is so adjusted that said concentration lies within a range of from $5.0\times10^{17}/cm^3$ to $1.0\times10^{20}/cm^3$.

155. A method for fabricating a semiconductor article according to claim 147, wherein a thickness of said p-type region is 500 Å or greater.

156. A method for fabricating a semiconductor article according to claim 147, wherein porosity of said porous layer is so controlled that said porosity is 50% or lower.

157. A method for fabricating a semiconductor article according to claim 147, wherein said porosity of said porous layer is so controlled that said porosity lies in a range of from 1% to 40%.

158. A method for fabricating a semiconductor article according to claim 147, wherein said porosity of said porous layer is so controlled that said porosity lies in a range of from 5% to 30%.

159. A method for fabricating a semiconductor article according to claim 147, wherein said non-porous single crystal layer is a single crystal Si layer.

160. A method for fabricating a semiconductor article according to claim 147, wherein said porous layer is formed in said p-type region in its entirety.

161. A method for fabricating a semiconductor article according to claim 147, wherein said porous layer is formed in a part of said p-type region.

162. A method for fabricating a semiconductor article according to claim 147, wherein said porous layer is also formed in a portion of said silicon body in which a portion said p-type region has not been formed.

163. A method for fabricating a semiconductor article according to claim 147, wherein a porous surface of said porous layer is oxidized.

164. A method for fabricating a semiconductor article according to claim 147, wherein said porous layer is heat-treated in a hydrogen atmosphere.

165. A method for fabricating a semiconductor article according to claim 147, wherein a porous surface of said porous layer is oxidized and then said porous layer is heat-treated in a hydrogen atmosphere, and then said non-porous semiconductor layer is formed.

166. A method for fabricating a semiconductor article comprising the steps of:
forming a p-type region on a whole surface of a silicon substrate;
forming a porous layer in said p-type region in its entirety or in a portion thereof;
forming a non-porous single crystal layer on said porous layer;
bonding said non-porous single crystal layer to a base substrate; and
removing any region unnecessary for fabricating said semiconductor article which has said non-porous single crystal layer remaining on said base substrate.

167. A method for fabricating a semiconductor article according to claim 166, wherein said non-porous single crystal layer is bonded to said base substrate with an insulation layer situated therebetween.

168. A method for fabricating a semiconductor article according to claim 166, wherein said unnecessary region comprises said porous layer and said silicon body.

169. A method for fabricating a semiconductor article according to claim 166, wherein said unnecessary region comprises said porous layer.

170. A method for fabricating a semiconductor article according to claim 167, wherein said insulation layer is formed on a surface of said non-porous single crystal layer.

171. A method for fabricating a semiconductor article according to claim 166, wherein said p-type region is formed by diffusing boron into the silicon substrate.

172. A method for fabricating a semiconductor article according to claim 171, wherein a concentration of boron contained in said p-type region is so adjusted that said concentration lies within a range of from $5.0\times10^{16}/cm^3$ to $5.0\times10^{20}/cm^3$.

173. A method for fabricating a semiconductor article according to claim 171, wherein said concentration of boron contained in said p-type region is so adjusted that said concentration lies within a range of from $1.0\times10^{17}/cm^1$ to $2.0\times10^{20}/cm$.

174. A method for fabricating a semiconductor article according to claim 171, wherein said concentration of boron contained in said p-type region is so adjusted that said concentration lies within a range of from $5.0\times10^{17}/cm^3$ to $1.0\times10^{20}/cm^3$.

175. A method for fabricating a semiconductor article according to claim 166, wherein a thickness of said p-type region is 500 Å or greater.

176. A method for fabricating a semiconductor substrate according to claim 166, wherein porosity of said porous layer is so controlled that said porosity is 50% or lower.

177. A method for fabricating a semiconductor article according to claim 166, wherein porosity of said porous layer is so controlled that said porosity is 50% or lower.

178. A method for fabricating a semiconductor article according to claim 166, wherein said porosity of said porous layer is so controlled that said porosity lies in a range of from 1% to 40%.

179. A method for fabricating a semiconductor article according to claim 166, wherein said porosity of said porous layer is so controlled that said porosity lies in a range of from 5% to 30%.

180. A method for fabricating a semiconductor article according to claim 166, wherein said porous layer is formed in said p-type region in its entirety.

181. A method for fabricating a semiconductor article according to claim 166, wherein said porous layer is formed in a part of said p-type region.

182. A method for fabricating a semiconductor article according to claim 166, wherein said porous layer is also formed in a portion of said silicon body in which a portion said p-type region has not been formed.

183. A method for fabricating a semiconductor article according to claim 166, wherein a porous surface of said porous layer is oxidized.

184. A method for fabricating a semiconductor article according to claim 166, wherein said porous layer is heat-treated in a hydrogen atmosphere.

185. A method for fabricating a semiconductor article according to claim 166, wherein a porous surface of said porous layer is oxidized and then said porous layer is heat-treated in a hydrogen atmosphere, and then said non-porous semiconductor layer is formed.

186. A method for fabricating a semiconductor article according to claim 147 wherein said porous layer is removed by etching.

187. A method for fabricating a semiconductor article according to claim 166 wherein said porous layer is removed by etching.

* * * * *

UNITED STATES PATENT AND TRADEMARK OFFICE
CERTIFICATE OF CORRECTION

PATENT NO. : 6,121,112
DATED : September 19, 2000
INVENTOR(S) : Kiyofumi Sakaguchi et al.

It is certified that error appears in the above-identified patent and that said Letters Patent is hereby corrected as shown below:

Title page,
Item [30] Foreign Application Priority Data, "August 29, 1905" should read -- August 2, 1995 --.

Column 2,
Line 34, "preferable," should read -- is obtained with this method, --; and
Line 45, "$10^{16}$ions/cm$^2$" should read -- $10^{18}$ions/cm$^2$ --.

Column 3,
Line 34, "is" should be deleted.

Column 5,
Line 13, "method," should read -- method --.

Column 6,
Line 63, "an element" should read -- elements --;
Line 64, "is" should read -- are --;
Line 66, "technique" should read -- technique, --; and
Line 67, "and," should be deleted.

Column 8,
Line 5, "are" should read -- is --.

Column 9,
Line 60, "oxidized" should read -- oxidized, --.

Column 10,
Line 11, "with a temperature that is exces-" should be deleted; and
Line 12, "sively high, the" should read -- if --.

Column 11,
Line 32, "and" should be deleted.

Column 16,
Line 37, "5(Am•cm$^{-2}$)" should read -- 5(mA•cm$^{-2}$) --.

Column 19,
Line 9, "H2;" should read -- $H_2$; -- and
Line 14, "H2" should read -- $H_2$ --.

UNITED STATES PATENT AND TRADEMARK OFFICE
CERTIFICATE OF CORRECTION

PATENT NO. : 6,121,112
DATED : September 19, 2000
INVENTOR(S) : Kiyofumi Sakaguchi et al.

It is certified that error appears in the above-identified patent and that said Letters Patent is hereby corrected as shown below:

Column 21,
Line 24, "non7porous" should read -- non-porous --.

Column 23,
Line 20, "greater." should read -- or greater. --; and
Line 40, "$Si_3N_4$, film." should read -- $Si_3N_4$ film. --.

Column 25,
Line 28, "e" should be deleted.

Column 29,
Line 15, "$2.0 \times 10^{20}$/cm." should read -- $2.0 \times 10^{20}$/cm$^3$ --; and
Line 46, "a portion" (second occurrence) should be deleted.

Column 30,
Line 27, "$1.0 \times 10^{17}$/cm$^1$" should read -- $1.0 \times 10^{17}$/cm$^3$ --;
Line 28, "$2.0 \times 10^{20}$/cm." should read -- $2.0 \times 10^{20}$/cm$^3$ --;
Line 36, "substrate" should read -- article --; and
Lines 36-38, Claim 176 should be deleted.

Column 31,
Line 4, "claim 147" should read -- claim 147, --.

Column 32,
Line 2, "claim 166" should read -- claim 166, --.

Signed and Sealed this

Twenty-sixth Day of February, 2002

*Attest:*

JAMES E. ROGAN
*Attesting Officer*  *Director of the United States Patent and Trademark Office*